United States Patent
Maldo et al.

(10) Patent No.: US 12,074,160 B2
(45) Date of Patent: Aug. 27, 2024

(54) ISOLATED 3D SEMICONDUCTOR DEVICE PACKAGE WITH TRANSISTORS ATTACHED TO OPPOSING SIDES OF LEADFRAME SHARING LEADS

(71) Applicant: SEMICONDUCTOR COMPONENTS INDUSTRIES, LLC, Phoenix, AZ (US)

(72) Inventors: Tiburcio A. Maldo, Consolacion (PH); Keunhyuk Lee, Suzhou (CN); Jerome Teysseyre, Scottsdale, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 843 days.

(21) Appl. No.: 16/948,796

(22) Filed: Oct. 1, 2020

(65) Prior Publication Data

US 2022/0020740 A1    Jan. 20, 2022

Related U.S. Application Data

(60) Provisional application No. 62/705,840, filed on Jul. 17, 2020.

(51) Int. Cl.
| | |
|---|---|
| *H01L 27/06* | (2006.01) |
| *H01L 21/48* | (2006.01) |
| *H01L 23/13* | (2006.01) |
| *H01L 23/498* | (2006.01) |

(52) U.S. Cl.
CPC ...... *H01L 27/0664* (2013.01); *H01L 21/4825* (2013.01); *H01L 21/4839* (2013.01); *H01L 23/13* (2013.01); *H01L 23/49861* (2013.01); *H01L 27/0629* (2013.01)

(58) Field of Classification Search
CPC ............ H01L 27/0664; H01L 21/4825; H01L 21/4839; H01L 23/13; H01L 23/49861; H01L 27/0629; H01L 2224/40245; H01L 23/36; H01L 23/3735; H01L 23/49524; H01L 23/49562; H01L 23/49575; H01L 23/49811; H01L 23/49531
See application file for complete search history.

(56) References Cited

U.S. PATENT DOCUMENTS

| | | | |
|---|---|---|---|
| 7,154,186 B2 * | 12/2006 | Noquil | ............. H01L 25/16 |
| | | | 257/676 |
| 7,663,211 B2 | 2/2010 | Noquil et al. | |
| 9,437,528 B1 | 9/2016 | Gong et al. | |
| 2002/0113304 A1 * | 8/2002 | Doh | ............. H01L 21/568 |
| | | | 257/E21.705 |

(Continued)

*Primary Examiner* — John P. Dulka
(74) *Attorney, Agent, or Firm* — Brake Hughes Bellermann LLP

(57) ABSTRACT

Described implementations provide wireless, surface mounting of at least two semiconductor devices on opposed surfaces of a leadframe, to provide an isolated, three-dimensional (3D) configuration. The described implementations minimize electrical failures, even for very high voltage applications, while enabling low inductance and high current. Resulting semiconductor device packages have mounting surfaces that provide desired levels of isolation and insulation, while still enabling straightforward mounting techniques, such as soldering, as well as high levels of thermal reliability.

20 Claims, 32 Drawing Sheets

(56) References Cited

U.S. PATENT DOCUMENTS

| | | | |
|---|---|---|---|
| 2004/0251557 A1* | 12/2004 | Kee | H01L 23/49575 |
| | | | 257/777 |
| 2007/0241393 A1 | 10/2007 | Hauenstein | |
| 2020/0258824 A1* | 8/2020 | Maldo | H01L 23/3735 |
| 2022/0115305 A1* | 4/2022 | Fujioka | H01L 23/49589 |

* cited by examiner

ISOLATED 3D SEMICONDUCTOR DEVICE PACKAGE WITH TRANSISTORS ATTACHED TO OPPOSING SIDES OF LEADFRAME SHARING LEADS

CROSS-REFERENCE TO RELATED APPLICATIONS

This application claims the benefit of U.S. Provisional Patent Application No. 62/705,840, filed on Jul. 17, 2020, the entire contents of which is incorporated herein by reference.

TECHNICAL FIELD

This description relates to semiconductor packaging techniques for power modules.

BACKGROUND

Semiconductor devices have been developed for use in various applications associated with power supply and power management. For example, power modules may use a combination of a transistor and a diode, such as an Insulated Gate Bipolar Transistor (IGBT) and a Fast Recovery Diode (FRD), or a Silicon Carbide (SiC) MOSFET with an integrated diode.

Such semiconductor devices are packaged to enable attachment to external elements, such as heatsinks and circuit boards, as well as to enable connections with other circuits. Semiconductor devices packaged within a power module, in particular, may have high demands in terms of electrical, mechanical, and thermal reliability.

SUMMARY

According to one general aspect, a semiconductor device package includes a leadframe having a first surface and a second, opposed surface, and having a first portion and a second portion that is laterally opposed from the first portion, and an L-shaped substrate having a diode attached thereto, the diode being connected to the first portion on the first surface, and the L-shaped substrate being connected to the second portion on the first surface. The semiconductor device package includes a transistor attached to a substrate and to the leadframe, the transistor being connected to the first portion and the second portion, on the second, opposed surface, by way of a conductive layer of the substrate.

According to another general aspect, a method of making a semiconductor device package includes attaching a diode to an L-shaped substrate, attaching the diode to a first portion of a first surface of a leadframe, and attaching the L-shaped substrate to a second portion of the first surface that is laterally opposed from the first portion. The method further includes attaching a transistor to a substrate, and attaching the transistor to the first portion of the leadframe and to the second portion of the leadframe, on a second, opposed surface of the leadframe, and connected using a conductive layer of the substrate.

According to another general aspect, a semiconductor device package includes a first transistor attached to a first substrate and to a first surface of a leadframe, with first transistor power leads on a side of the leadframe, and a second transistor attached to a second substrate and to a second surface of the leadframe, with second transistor power leads on the side of the leadframe.

According to another general aspect, a method of making a semiconductor device package includes attaching a first transistor to a first substrate, and attaching the first transistor and the first substrate onto a first surface of a leadframe, with first transistor power leads on a side of the leadframe. The method further includes attaching a second transistor to a second substrate, and attaching the second transistor and the second substrate onto a second, opposed surface of the leadframe, with second transistor power leads on the side of the leadframe.

The details of one or more implementations are set forth in the accompanying drawings and the description below. Other features will be apparent from the description and drawings, and from the claims.

DETAILED DESCRIPTION

As referenced above, power module packaging should provide high levels of electrical, mechanical, and thermal reliability, in a cost-efficient and space-efficient manner. Accordingly, described implementations provide wireless, surface mounting of at least two semiconductor devices (e.g., two semiconductor die) on opposed surfaces of a leadframe, to provide an isolated, three-dimensional (3D) configuration.

The described implementations minimize electrical failures due to arcing and other breakdown events, even for very high voltage applications. Described implementations reduce or eliminate inductances that may otherwise make high-speed switching unreliable, and enable efficient electrical performance, including high-current capacity. Resulting semiconductor device packages have mounting surfaces (e.g., for mounting to a circuit board and/or heatsink) that provide desired levels of isolation and insulation, while still enabling straightforward mounting techniques, such as soldering, as well as high levels of thermal reliability.

Figure 1:
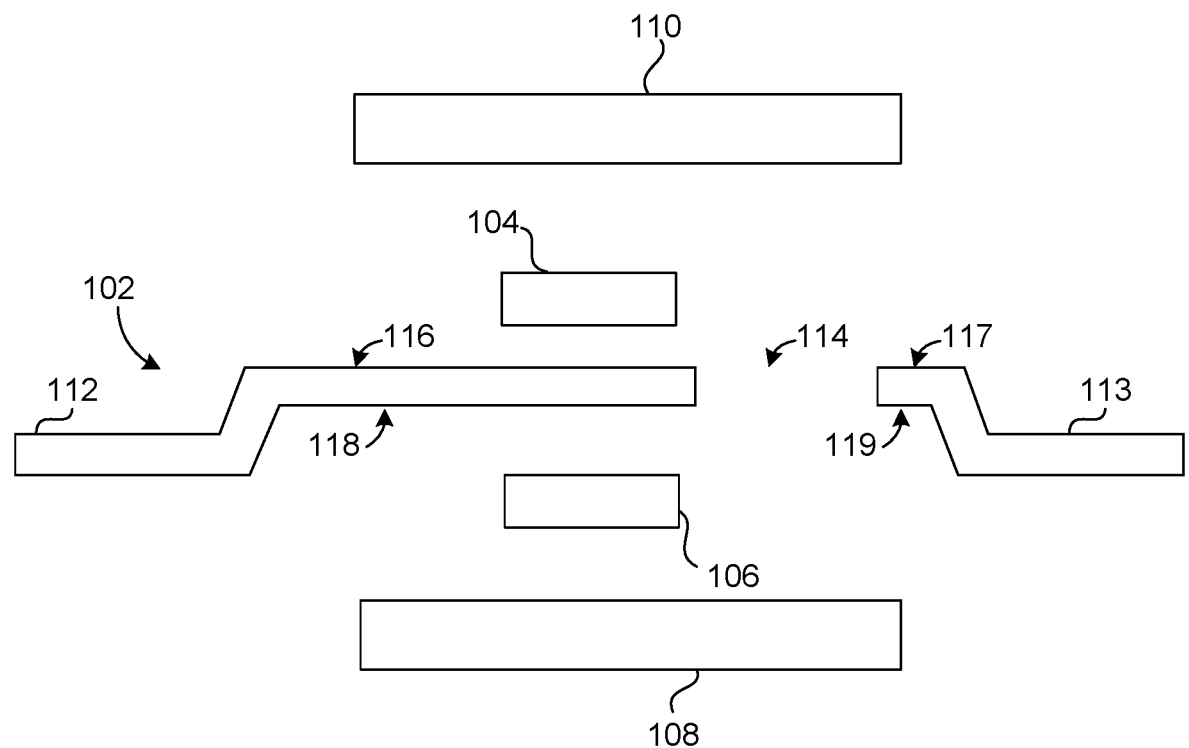
FIG. 1 is a simplified, partially exploded view of an isolated 3D semiconductor device package with surface mounted devices.

FIG. 1 is a simplified, partially exploded view of an isolated 3D semiconductor device package with surface mounted devices. In FIG. 1, a leadframe 102 is used to attach a first semiconductor device 104 and a second semiconductor device 106. For example, the first semiconductor device 104 may include an IGBT, while the second semiconductor device 106 may include a FRD, as shown in the examples of FIGS. 2-8. In other examples, the two semiconductor devices 104, 106 may each represent a Silicon Carbide (SiC) transistor with an integrated diode, such as may be used in a half-bridge inverter configuration, as shown in FIGS. 9-37.

In FIG. 1, a first substrate 108 is positioned for attaching to a first side of the leadframe 102, and a second substrate 110 is positioned for attaching to a second, opposing side of the leadframe 102. The substrates 110, 112 may include Copper (Cu), or other suitable connecting layer. For example, one or both of the substrates 110, 112 may be implemented using direct bonded copper (DBC) substrates, which include a first copper layer, a dielectric layer, and a second copper layer, as described and illustrated in more detail, below. In other implementations, at least one of the substrates 108, 110 may be implemented using a Cu redistribution layer (RDL).

As described an illustrated in detail, below, the leadframe 102 may include multiple leads 112, 113 having, e.g., a gull wing configuration in which the surface mount leads are folded or bent to establish device and surface points of connection that are separated vertically by an intervening portion. Although only two leads 112, 113 are visible in the simplified exploded side view of FIG. 1, the leadframe 102 may include, e.g., a total of 6-12 leads or more, depending on included semiconductor devices and desired connections thereto. Therefore, in the remaining description of FIG. 1, reference to the lead 112 should be understood to potentially include reference to any one of a plurality of leads on a same side of the leadframe 102 as the lead 112, with similar comments applying to the lead 113.

In the example of FIG. 1, the lead 112 and the lead 113 are separated by a space 114. Accordingly, as illustrated and described below, the substrates 108, 110 may be used to physically and/or electrically connect the semiconductor devices 104, 106 across the space 114 and between the leads 112, 113. As the semiconductor devices 104, 106 may also be connected directly to the leadframe 102 (that is, in addition to being connected to the leadframe 102 by the substrate(s) 108, 110), the configuration of FIG. 1 provides straightforward electrical connections between the semiconductor devices 104, 106, as well as between the spaced leads 112, 113.

For example, when the semiconductor device 106 represents a FRD, the substrate 108 may be used to connect a cathode of the FRD to the lead 113, while the anode of the FRD is directly connected to the lead 112. When one or both of the semiconductor devices 104, 106 represents a transistor, such as an IGBT or SiC MOSFET, a drain/collector and source/emitter may similarly be connected across the space 114. Accordingly, a 3D SMD configuration is provided, in which no wires are required to enable desired connections to and/or between the semiconductor devices 104, 106.

In the simplified example of FIG. 1, the lead 112 is illustrated as having a first surface 116, and a second, opposed surface 118, while the lead 113 is illustrated as having a first surface 117, and a second, opposed surface 119. The substrates 108 and 110 are illustrated using simple planar surfaces. However, in various example implementations, portions of the leads 112, 113 and/or the substrates 108, 110 may be formed to facilitate the above-referenced connections to the semiconductor devices 104, 106. For example, the leads 112, 113 and/or the substrates 108, 110 may have additional or alternative portions, not illustrated in FIG. 1, which enable desired connections to the semiconductor devices 104, 106.

For example, one or both of the substrates 108, 110 may have a portion that is perpendicular to the illustrated substrates 108, 110, where such portion may be mounted to a corresponding lead 112, 113. In other examples, one or both of the leads 112, 113 may be modified to facilitate desired connections.

For example, one of the surfaces 116, 117 may have an upset to facilitate connection to the substrate 110, and/or one of the surfaces 118, 119 may have a downset to facilitate connection to the substrate 108. In the following description, the terms upset and downset refer to an end portion of a lead of a leadframe that provides a surface that is parallel to, but not coplanar with, an adjacent surface of the lead. In the following, an upset refers to such a portion that provides a surface in a direction of the semiconductor device 104 and the substrate 110, while a downset refers to such a portion that provides a surface in a direction of the semiconductor device 106 and the substrate 108. An upset or downset may be joined to an adjacent portion of a lead by an angled lead portion.

In still other example implementations, the semiconductor device 104 and the substrate 110 may be embedded together into a single package. In such embodiments, the embedded device/substrate package may provide a planar surface that is suitable for attaching directly to one or both of the surfaces 116, 117.

Further, the package of FIG. 1 may provide straightforward external mounting, e.g., to one or more heatsinks, or to a printed circuit board (PCB). For example, when one or both of the substrates 108, 110 represents a DBC substrate, such a DBC substrate may be soldered to a heatsink, or to a PCB. In such implementations, it is therefore not necessary to utilize an external mounting clip or other mechanical mounting apparatus to obtain a desired result, including a desired level of mounting reliability, and desired levels of isolation and insulation. Other mounting options are also possible, some of which are described below.

Figure 2:
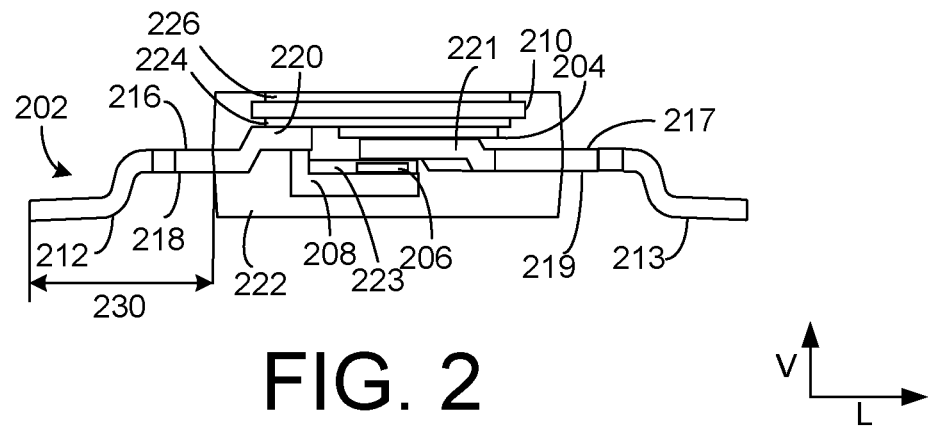
FIG. 2 is a side view of an example implementation of the isolated 3D semiconductor device package of FIG. 1, with an IGBT and a FRD.

FIG. 2 is a side view of an example implementation of the isolated 3D semiconductor device package of FIG. 1, with an IGBT and a FRD. In the example of FIG. 2, a leadframe 202 has an IGBT 204 and a FRD 206 attached thereto. The FRD 206 is disposed on a substrate 208, while the IGBT 204 is disposed on a substrate 210. In the example of FIG. 2, as illustrated and described in detail, below, the substrate 208 on which the FRD 206 is disposed may be formed using a Cu RDL, while the substrate 210 on which the IGBT 204 is disposed may be provided using a DBC substrate.

The substrate 208 may be connected to a cathode of the FRD 206, and to a lead 212 of the leadframe 202, while an anode of the FRD 206 may be connected directly to a lead 213. As shown, the substrate 208 (and thus the cathode of the FRD 206) may be connected to a surface 218 of the lead 212, while the anode of the FRD 206 may be connected to a surface 219 of the lead 213. As illustrated in detail below with respect to FIG. 7, the FRD 206 may be embedded within mold material 223.

Similarly, and as referenced above with respect to FIG. 1, the substrate 210 enables desired physical and electrical connections of the IGBT 204 with respect to the leadframe 202. As shown and described in more detail, below, with respect to FIGS. 3-6, the substrate 210 enables current flow across the leadframe 202 (e.g., from a lead on the side of lead 213 to a lead on the side of lead 212, such as emitter/collector or (when other type(s) of transistors are included instead of an IGBT) source/drain current flow), while also providing a desired gate connection. Moreover, the substrate 210 enables straightforward bonding (e.g., solder bonding) to external components.

In FIG. 2, the IGBT 204 may be attached to a surface 216 of the lead 212, as well as to a surface 217 of the lead 213. More specifically, as shown, the substrate 210 may be attached to an upset 220 of the lead 212, which is offset from an upset 221 of the lead 213 by a thickness equivalent to a thickness of the IGBT 204 (and a thickness(es) of any associated solder or other bonding material, not separately illustrated in FIG. 2).

As described above, the upset 220 provides a portion of the surface 216 that is parallel to, but not coplanar with, an adjacent portion of the lead 212, and connected by an intervening angled lead portion. Similarly, the upset 221 provides a portion of the surface 217 that is parallel to, but not coplanar with, an adjacent portion of the lead 213, and connected by an intervening angled lead portion.

In this way, a level or planar mounting of the substrate 210 may be achieved. Moreover, the illustrated L-shaped structure of the substrate 208, enables connection to the upset 220, while maintaining a planar surface of the substrate 208, and of the FRD 206, that is parallel to the substrate 210. Accordingly, as referenced above and described in more detail, below, the surface of the substrate 210 may be easily soldered to mount the implementation of FIG. 2 to, e.g., a heatsink.

As shown, the L-shaped substrate 208 includes a lateral portion in the illustrated direction L with a surface that is coplanar with the IGBT 204 and the substrate 210, and a vertical portion in the illustrated direction V that provides a surface perpendicular to a plane of the IGBT 204 and the substrate 210. In the example, the lateral portion is longer than the vertical portion, but as described herein, the L-shaped substrate 208 may have any dimensions needed to enable the co-planar mounting of the FRD 206 with the IGBT 204 and the substrate 210.

Further in FIG. 2, the DBC substrate 210 may include a first conductive layer 224 (e.g., Cu), and a second conductive layer 226 (e.g., Cu). As illustrated and described in detail, herein, the first conductive layer 224 may be used to define desired electrical connections. For example, in FIGS. 2-4, the first conductive layer 224 may electrically connect the collector leads 212, 302-310 to a collector of the IGBT 204.

Meanwhile, the second conductive layer 226 may be used for solder mounting to a heatsink, or other external connection. In this way, and due to the use of DBC as the substrate 210, full isolation may be provided, while still providing desired levels of thermal conductivity and reliability.

Finally in FIG. 2, a suitable mold material 222 may be used to encapsulate the described device structure and provide a final package outline. For example, an Epoxy Molding Compound (EMC) mold material may be used, which may be ground as needed to expose the bonding surface of the substrate 210.

Figure 3:
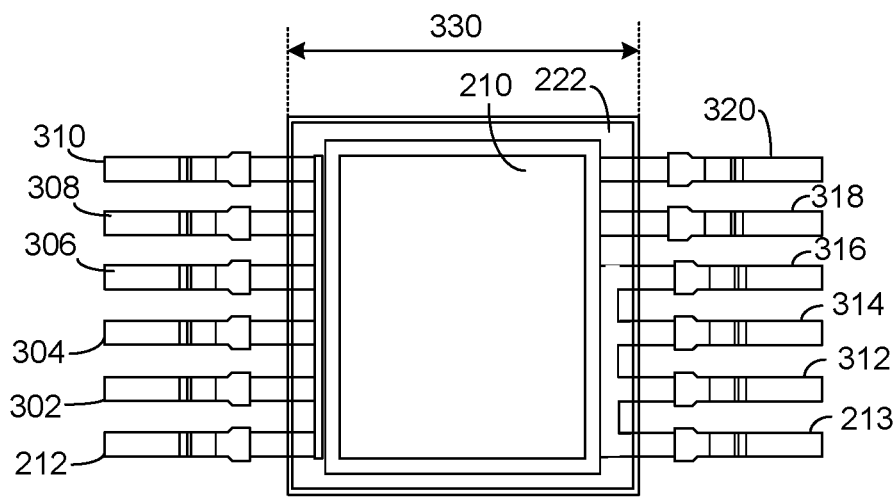
FIG. 3 is a top view of the example implementation of FIG. 2.
Figure 4:
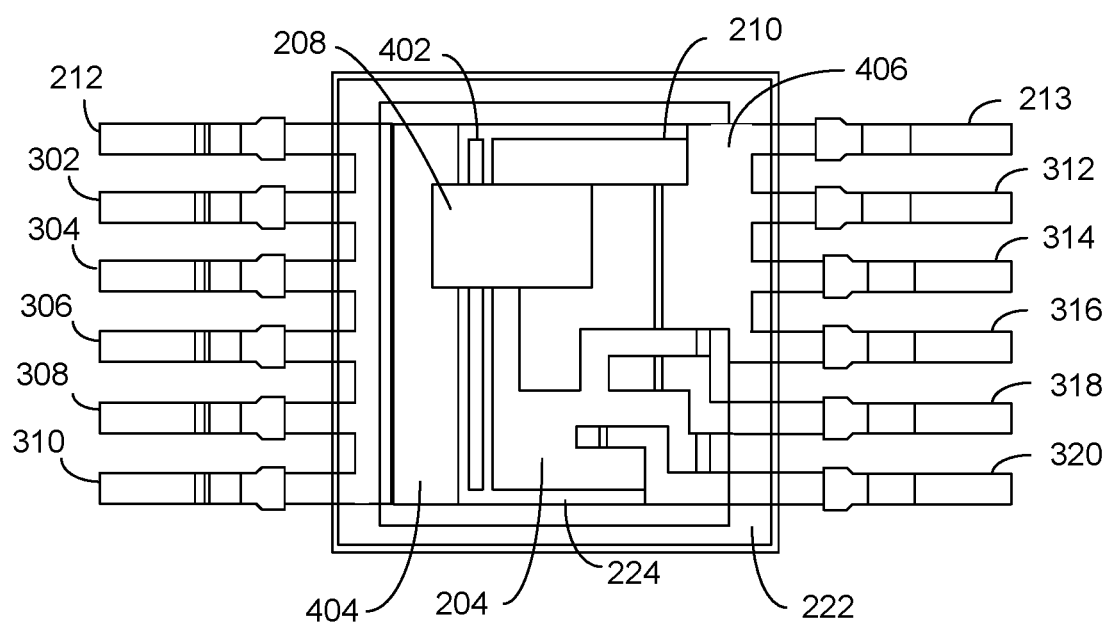
FIG. 4 is a bottom view of the example implementation of FIG. 2.

FIG. 3 is a top view of the example implementation of FIG. 2, and FIG. 4 is a bottom view of the example implementation of FIG. 2. FIGS. 3 and 4 illustrate a plurality of collector leads or pins, including the lead 212, as well as leads 302, 304, 306, 308, and 310. Further in FIGS. 3 and 4, the lead 213 illustrates a first emitter lead, while leads 312, 314, 316 illustrate additional emitter leads. Sense lead 318 and gate lead 320 are also illustrated.

As may be observed in the bottom view of FIG. 4, and as further illustrated and described, below, with respect to FIG. 6, a solder resist material 402 may be used to divide portions of the substrate 210 and prevent unwanted solder connections. Specifically, a leadframe portion 404 that is commonly connected to all of the collector leads 212, 302-310 may be soldered to the substrate 210, while a leadframe portion 406 that is commonly connected to the various emitter terminals 213, 312-318 may also be soldered to the substrate 210, without unwanted solder connections therebetween.

The described embodiments of FIGS. 2-4 provide a substantially improved creepage distance (e.g., shortest distance along an insulator between two conducting elements, so that creepage is associated with device failure or malfunction) between emitter and collector (or source and drain), as compared to conventional devices. For example, in conventional devices, an IGBT and FRD may be placed next to one another on a single surface of a substrate, and connected laterally by wires, which results in a creepage distance in a range of, e.g., 1-3 mm.

In FIGS. 2-4, the described 3D SMD configuration enables a much longer creepage distance. For example, in FIG. 3, a surface distance 330 of the package outline across the surface of the substrate 210 and the mold material 222 may be several times larger or more than standard comparable creepage distances, e.g., 8-10 mm or more. Further, in FIG. 2, the illustrated gull wing configuration provides a distance 230 between the end of the package outline and an end of the lead 212 (and similarly for remaining leads), where the distance 230 may be several millimeters or more, e.g., 5 mm.

Thus, by attaching the IGBT 204 and the FRD 206 on opposed surfaces 216/217 and 218/219 of the leadframe 202, along a vertical direction V that is perpendicular to a lateral direction L that is parallel to the leads 212, 213, 302-320 of the leadframe 202, current flow is defined laterally across the device package, and creepage and distances may be improved, as described.

As a result, the embodiments of FIGS. 2-4 are highly suited for high voltage, high current applications, e.g., in a range of 1700V or more, or 400 A or more. Further, the wireless, direct bonding of the emitter and collector (or source and drain), additionally facilitates reliable execution of high current applications.

Figure 5:
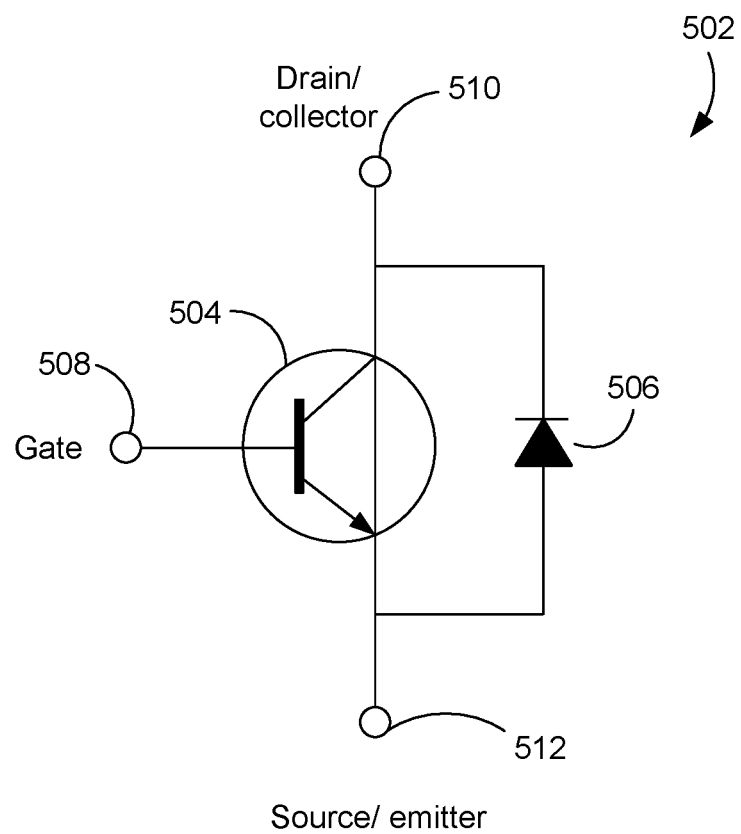
FIG. 5 is an example circuit diagram corresponding to the example implementation of FIG. 2.

FIG. 5 is an example circuit diagram 502 corresponding to the example implementation of FIG. 2. In the example of FIG. 5, a transistor 504 is connected in parallel with a diode 506. As may be appreciated from the above descriptions of FIGS. 2-4, the transistor 504 may represent the IGBT 204, while the diode 506 may represent the FRD 206. As further illustrated, the transistor 504 may include a gate 508, a drain or collector 510, and a source or emitter 512. FIG. 5 thus represents a commonly-used circuit configuration, which may be implemented using the example embodiments of FIGS. 2-4, and which provide the various features and advantages described herein.

Figure 6:
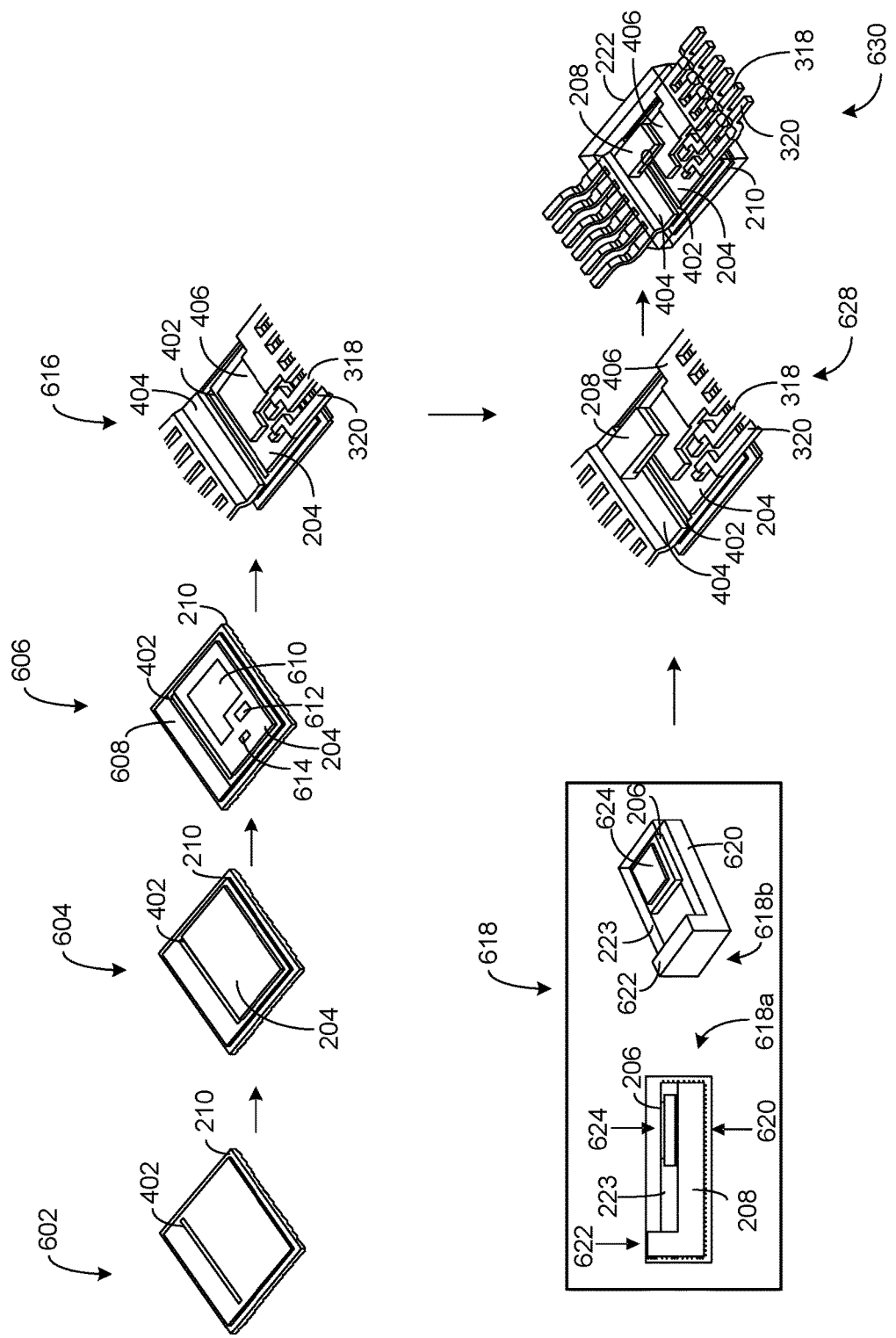
FIG. 6 is an example process flow for assembling the example implementation of FIG. 2.

FIG. 6 is an example process flow for assembling the example implementation of FIG. 2. In the example of FIG. 6, in an operation 602, the solder resist material 402 is applied to the substrate 210. In a process 604, the IGBT 204 is soldered to the substrate 210 on one side of the solder resist material 402, e.g., using Silver (Ag) sintering or a high lead (Pb) solder.

In an operation 606, solder preform 608 is formed on one side of the solder resist material 402, on the substrate 210. On the IGBT 204, solder preform 610 is provided for emitter connections, solder preform 612 is provided for a sense connection, and a solder preform 614 is provided for a gate connection. For example, the solder preforms 608-614 on the die surface and DBC substrate 210 may be formed using high Pb solder preform.

In an operation 616, the leadframe portion 404 may be soldered to the solder preform 608. Similarly, the leadframe portion 406 may be soldered to the source solder preform 610, while the lead 318 is soldered to the sense solder preform 612. The gate lead 320 may be soldered to the gate solder preform 614.

In an operation 618, the substrate 208 is illustrated as including a portion 620 and a perpendicular portion 622, so that the substrate 208 is implemented as an L-shaped copper redistribution layer (RDL), which is electrically connected to the cathode of the FRD 206. The FRD 206, including an anode 624, is embedded within a suitable mold material 222. Differing views 618a and 618b are illustrated.

In an operation 628, the substrate 208 may be attached (e.g., reflow soldered) to the leadframe portion 404 (e.g., collector), while the anode 624 is connected to the leadframe portion 406 (e.g., emitter). Finally in FIG. 6, in an operation 630, the mold material 222 may be added to complete the final package outline.

Figure 7:
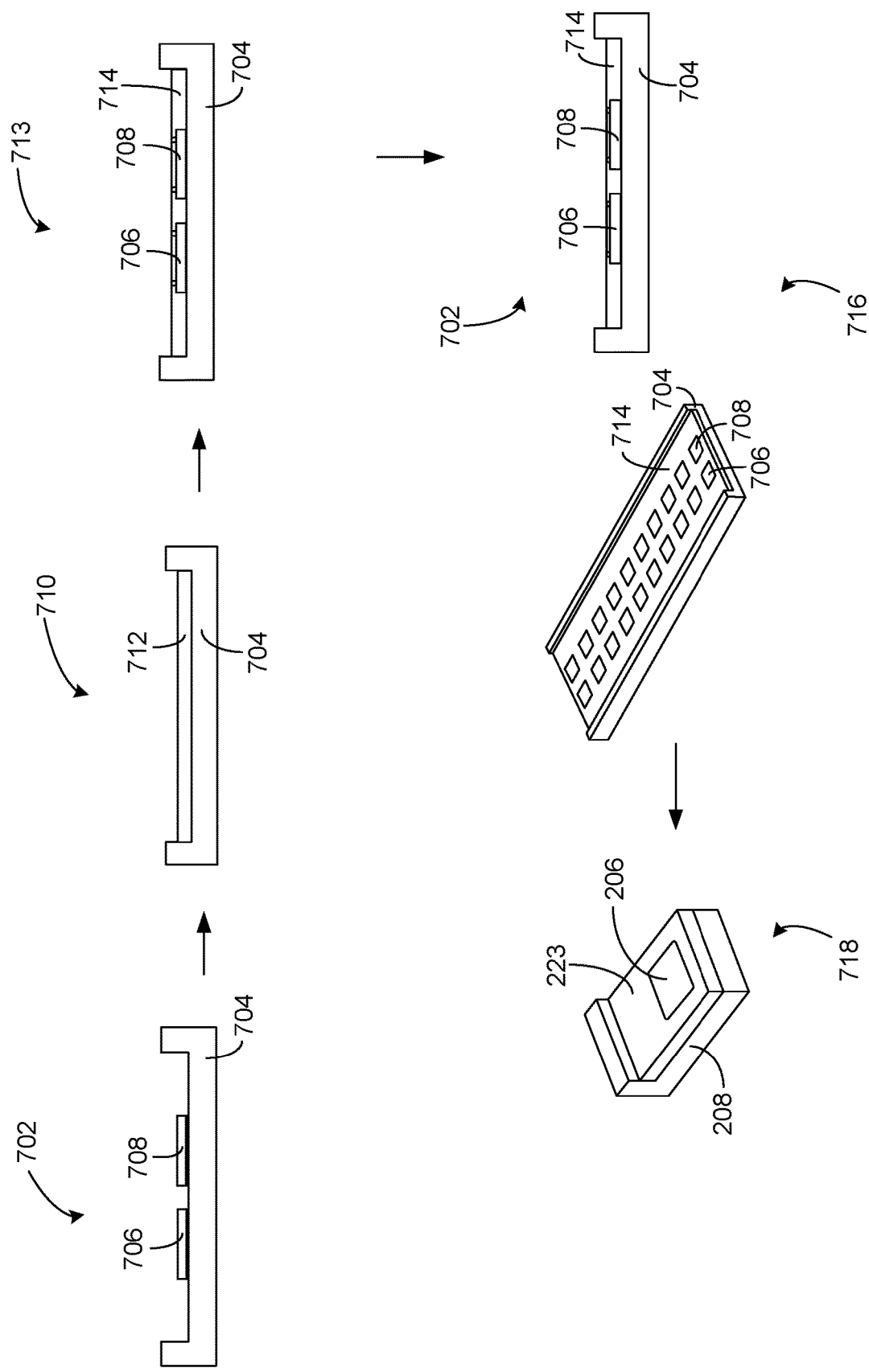
FIG. 7 is an example process flow for assembling a FRD co-pack that may be used in the examples of FIGS. 2 and 6.

FIG. 7 is an example process flow for assembling a FRD co-pack that may be used in the examples of FIGS. 2 and 6. For example, the operation 618 of FIG. 6 may be implemented using a pre-assembled FRD package constructed using the process of FIG. 7, or similar, for ease of assembly in performing the process flow of FIG. 6.

As shown in FIG. 7, in an operation 702, a substrate 704, e.g., a Cu substrate, may have a plurality of FRD devices, represented by FRD 706 and FRD 708, attached thereto. For example, sintering, such as Ag sintering, or soldering, such as high Pb lead soldering, may be used.

In a process 710, lamination 712 may be added to encapsulate or embed the FRDs 706, 708. In an operation 713, laser ablation may be used to reduce the lamination 712, shown as mold material 714, and enable subsequent connection of the FRDs 706, 708. In an operation 716, Cu layer plating may be performed, followed by sawing for singulation in a process 718, to obtain the pre-assembled FRD package used in FIG. 6.

Figure 8:
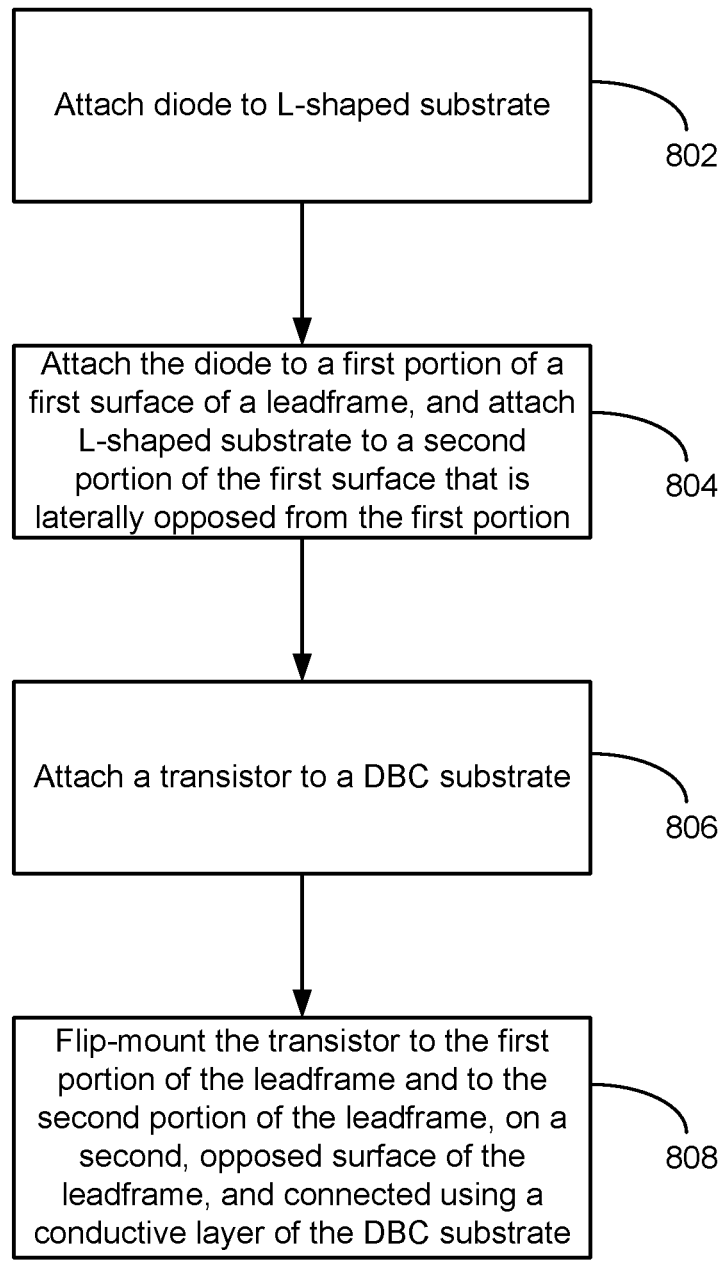
FIG. 8 is a flowchart illustrating example process steps corresponding to described examples.

FIG. 8 is a flowchart illustrating example process steps corresponding to described examples. In the example of FIG. 8, a diode is attached to an L-shaped substrate (802). For example, the FRD 206 of FIGS. 2-4 and 6 may be attached to the L-shaped substrate 208.

The diode may be attached to a first portion of a first surface of a leadframe, and the L-shaped substrate may be attached to a second portion of the first surface that is laterally opposed from the first portion (804). For example, in FIGS. 2-4 and 6, the FRD 206 may be attached to the portion 406 of the leadframe 202, and the L-shaped substrate 208 may be attached to the portion 404 of the leadframe 202, thereby bridging a space defined by the solder resist material 402 and corresponding to space 114 of FIG. 1.

The portions 404, 406 are laterally opposed along the lateral direction L defined by the parallel leads 212, 213, 302-320 of the leadframe 202. As described with respect to FIG. 2, the FRD 206 may be attached to a surface of the leadframe 202 corresponding to surfaces 218, 219. As also described, the FRD 206 may have its cathode attached to the L-shaped substrate and thereby to the second portion of the leadframe, while an anode of the FRD 206 is directly attached to the first portion of the leadframe. The first portion 404 and the second portion 406 may be offset from one another along the vertical direction V that is perpendicular to the lateral direction defined by the parallel leads of the leadframe 202, and by an amount corresponding to a length of the perpendicular portion 622 of the L-shaped substrate 208 in the vertical direction. Thereby, planar mounting of the FRD 206 and of the portion 620 of the L-shaped substrate may be ensured.

A transistor may be connected to a DBC substrate (806). For example, the IGBT 204 may be connected to the DBC substrate 210 pins, as illustrated in FIGS. 2-4 and 6.

The transistor may then be attached to the first portion of the leadframe and to the second portion of the leadframe, on a second, opposed surface of the leadframe, and connected using a conductive layer of the DBC substrate (808). For example, the IGBT 204 may be flip-mounted and connected to the portion 404 and the portion 406 of the leadframe 202, on a surface corresponding to the surfaces 216/217.

Figure 9:
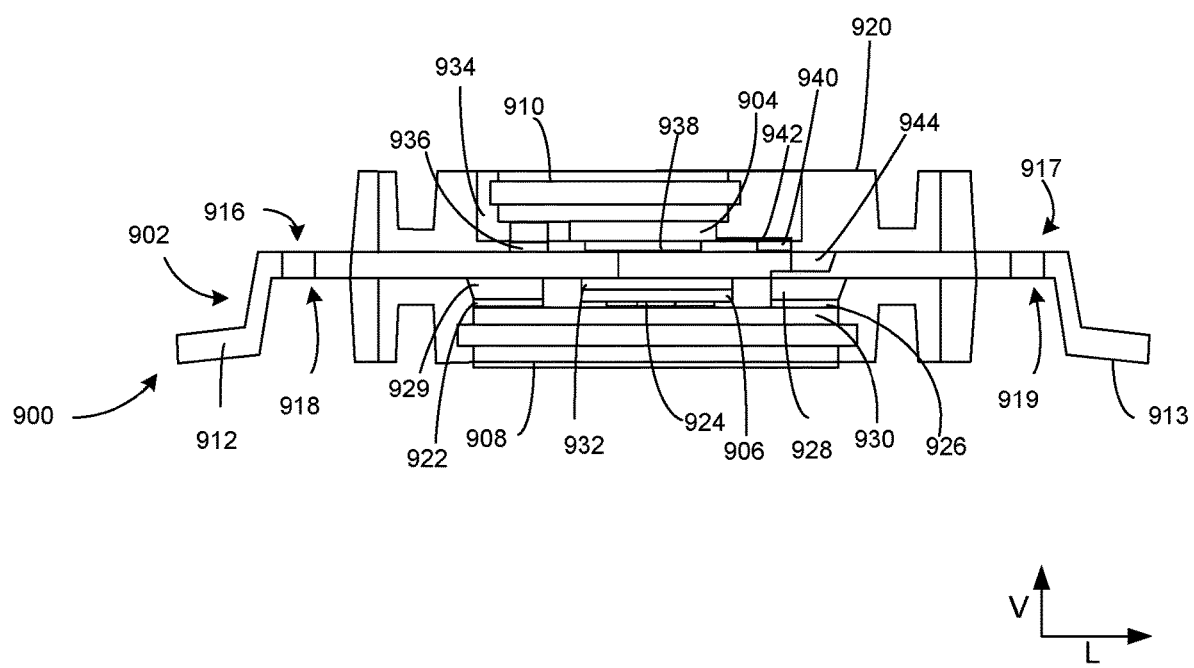
FIG. 9 is a side view of another example implementation of the isolated 3D semiconductor device package of FIG. 1, with dual MOSFETs and including an embedded die structure.
Figure 10:
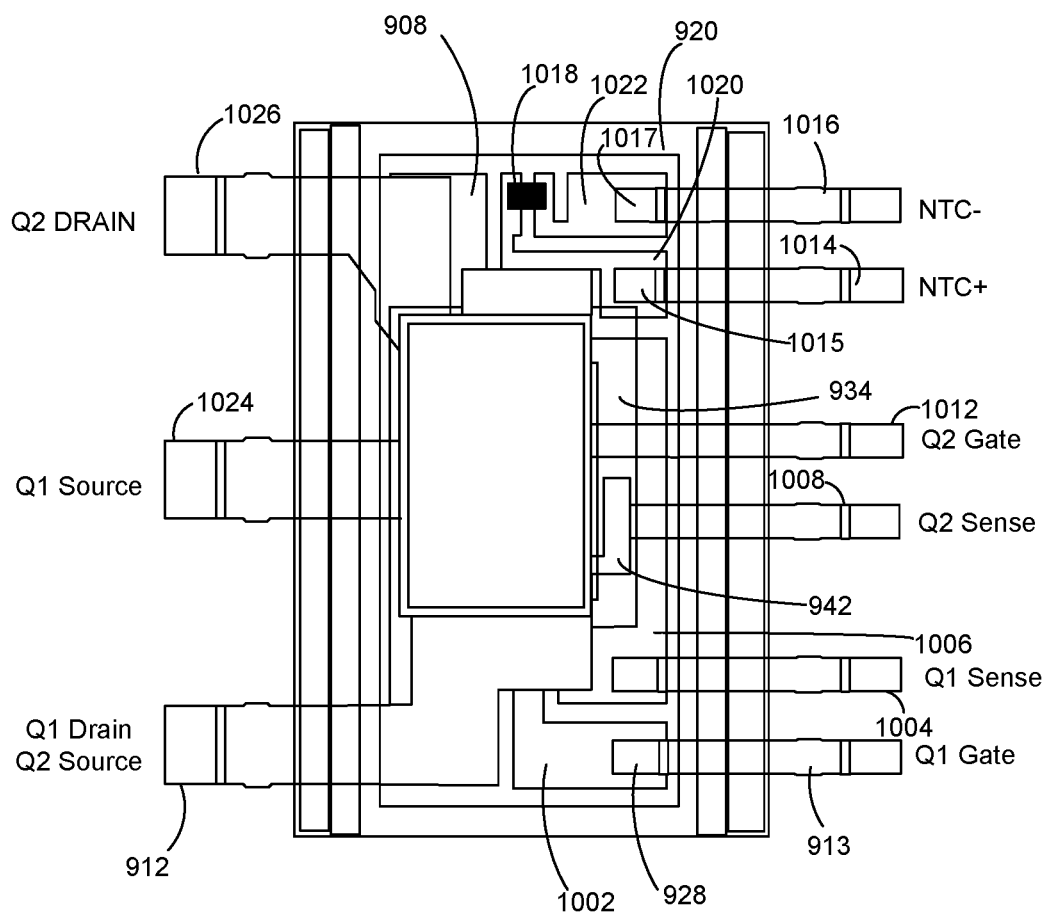
FIG. 10 is a top view of the example implementation of FIG. 9.
Figure 11:
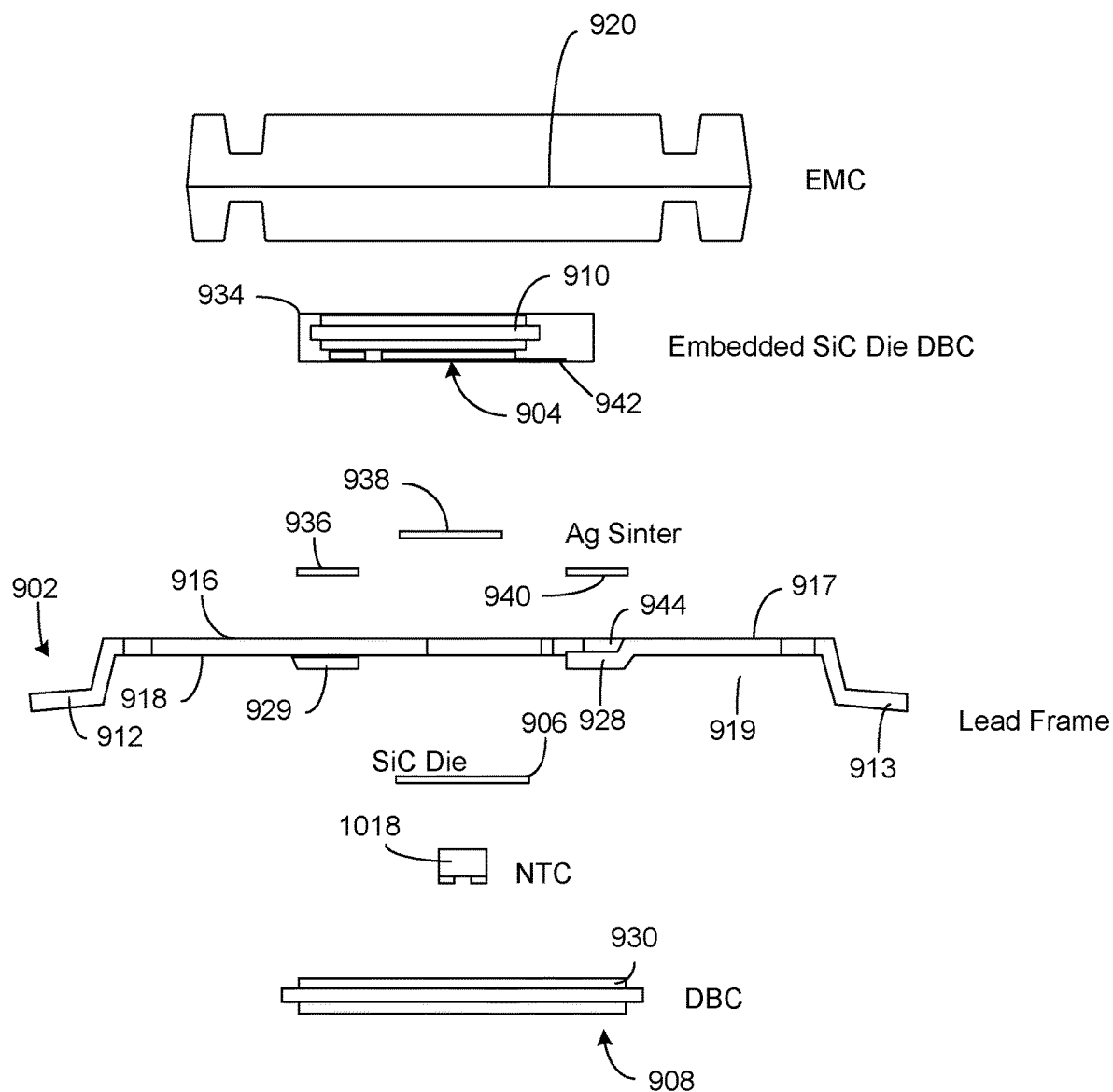
FIG. 11 is an exploded side view of the example implementation of FIG. 9.
Figure 12:
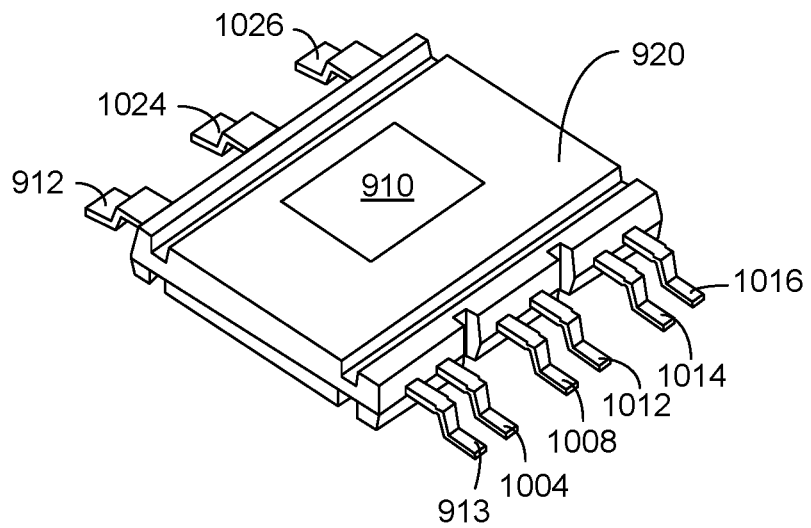
FIG. 12 is a top angle view of a final package outline corresponding to the example implementation of FIG. 9.
Figure 13:
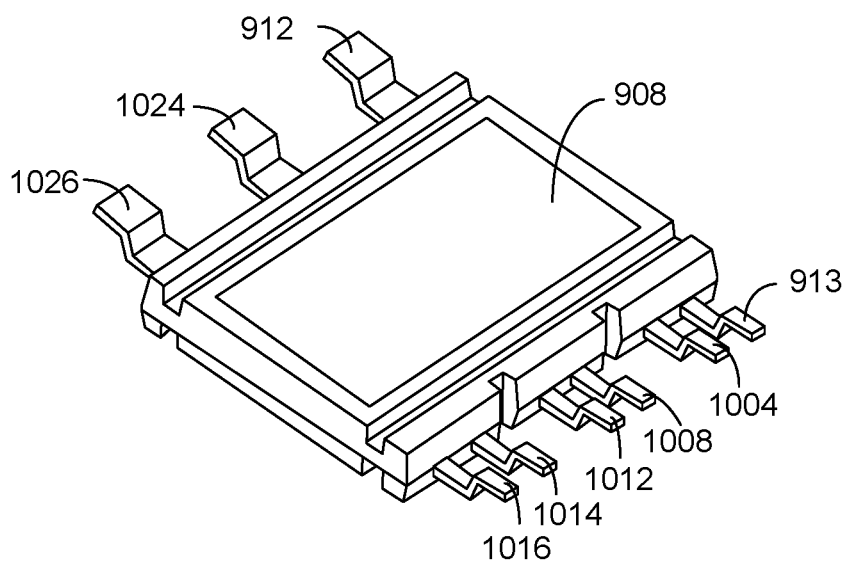
FIG. 13 is a bottom angle view of the final package outline of FIG. 12.

FIG. 9 is a side view of another example implementation of the isolated 3D semiconductor device package of FIG. 1, with dual MOSFETs and including an embedded die structure. FIG. 10 is a top view of the example implementation of FIG. 9. FIG. 11 is an exploded side view of the example implementation of FIG. 9. FIG. 12 is a top angle view of a final package outline corresponding to the example implementation of FIG. 9, and FIG. 13 is a bottom angle view of the final package outline of FIG. 12.

In the example of FIGS. 9-13 and following examples, the referenced MOSFETs may include a SiC MOSFET and included diode, where structural details and associated operations are not generally illustrated or described in detail, except as may be helpful to understand the embodiments described herein. Moreover, it will be appreciated that other types of devices may be use, as well. A more specific example circuit implementation is described below, with respect to FIG. 20.

In FIG. 9, a semiconductor device package 900 includes a leadframe 902, with a first MOSFET 906 and a second MOSFET 904 attached thereto. A first substrate 908 is connected to the first MOSFET 906, and to the leadframe 902, while a second substrate 910 is connected to the second MOSFET 904, and to the leadframe 902.

More specifically, FIG. 9 illustrates that the leadframe 902 includes a lead 912 on one side, and a lead 913 on an opposed side, thereby defining a total lateral distance across the leadframe 902 from an end of the leadframe 912 to a most-distant end of the lead 913, in a direction L. The first surface of the leadframe 902 on which the second MOSFET 904 is attached includes a first surface 916 on a side of the leadframe 902 with the lead 912 and a second surface 917 on a side of the leadframe 902 with the lead 913. The second, opposed surface of the leadframe 902 on which the first MOSFET 906 is attached, and opposed in a vertical direction V perpendicular to the lateral direction L, includes a first surface 918 on the side of the leadframe with the lead 912, and a second surface 919 on the side of the leadframe 902 with the lead 913. In the present description, the surfaces 916, 917, 918, 919 should be understood to refer to surfaces of the leadframe 902, and not necessarily to the individual leads 912, 913, unless specifically noted otherwise. Mold material 920 encases the MOSFETs 904, 906 and the substrates 908, 910.

The first MOSFET 906 and the substrate 908 are attached to one another and to the leadframe 902 using layers 922, 924, 926, which may represent, e.g., Ag sinter paste. More specifically, the layer 922 attaches the substrate 908 to a downset 929 (of a lead 1024, shown in FIG. 10). The layer 924 attaches the first MOSFET 906 to the substrate 908, and the layer 926 attaches the substrate 908 to a downset 928 of the lead 913. More specifically, the layers 922, 924, 926 are attached to a conductive layer (e.g, Cu) 930 of the substrate 908.

The first MOSFET 906 is attached to the leadframe 902 using a layer 932. Additional layers of Ag sinter paste used to attach the first MOSFET 906 and the substrate 908 to one another and/or to the leadframe 902, not visible or illustrated in FIGS. 9-11, are illustrated below, e.g., in FIG. 18.

The second MOSFET 904 and the substrate 910 are illustrated as being embedded within mold material 934, providing a package within the overall package 900 of FIG. 9, and which is illustrated and described in detail, below, with respect to FIGS. 14-17. The second MOSFET 904 is then connected to the leadframe 902 using layers 936, 938, 940 of, e.g., Ag sinter paste. More specifically, the layer 936 connects a drain of the second MOSFET 904 to the leadframe 902 (e.g., to a lead 1026 of FIG. 10). The layer 938 connects a source of the second MOSFET 904 to the lead 912. The layer 940 connects an extended gate contact 942 of the second MOSFET 904 to the leadframe 902 (e.g. to a portion 944 of a lead 1008 of FIG. 10). The extended gate contact is described in detail below, with respect to FIGS. 14-17.

In the top view of FIG. 10, in which the first MOSFET 906 is referred to as Q1 and the second MOSFET 904 is referred to as Q2, an etched conductive portion 1002 of the conductive layer 930 of the substrate 908 is attached to the downset 928 of the lead 913 (using layer 930, as shown in FIG. 9), and thus to a gate of the first MOSFET 906. Similarly, a lead 1004 is attached to a conductive portion 1006 of the conductive layer 930 of the substrate 908.

A lead 1008 is attached at the portion 944 of FIG. 9 to the extended gate contact 942 of the second MOSFET 904. As can be seen in FIG. 10, and described in more detail, below, the extended gate contact 942 facilitates a gate connection of the second MOSFET 904 to the lead 1008, including maintaining a desired spacing between the lead 1008 and a lead 1012.

Also visible in FIG. 10, a lead 1014 connects to a first terminal of a negative temperature coefficient (NTC) thermistor 1018 by way of conductive portion 1020 of the conductive layer 930 of the substrate 908 being attached to a downset 1015 of the lead 1014. A lead 1016 is similarly connected to a second terminal of the NTC 1018 by way of conductive portion 1022 being attached to a downset 1017 of the lead 1016. By including the NTC 1018 within the package of FIGS. 9-13 as a temperature sensor, convenient and accurate temperature sensing may be provided. In the example of FIG. 10, the substrate 908 may include a DBC with half etch. In some implementations, the NTC 1018 may be implemented as a tin-plated terminal NTC, which may have a solder connection to conductive portions 1020, 1022.

In example implementations, the example of FIGS. 9-13 may be used to provide half bridge circuitry or similar power circuits with a voltage rating of well over 1200V; e.g., over 1700V. For example, due to the described construction, both creepage distance (e.g., shortest distance over an intervening surface, as referenced above), as well as a clearance distance (e.g., shortest distance through air) may be increased. For example, lead 1024 (source of the first MOSFET 906) and lead 1026 (drain of the second MOSFET 904) may be separated by creepage and clearance distances that exceed 5 mm. Similar comments apply to the lead 1024 and the lead 912, with the latter being a common node of the drain of the first MOSFET 906 and the source of the second MOSFET 904.

Similar creepage distances may be maintained on the opposed side of the leadframe 902, such as between leads 1004 and 1008 and between 1012 and 1014. Due to the closer spacing associated with the greater number of leads, corresponding clearance distances may be relatively reduced, e.g, may be in a range of 3-4 mm for corresponding creepage distances of 5-6 mm.

The described implementations are thus highly suitable for high power applications, because all source and drain connections are on one side of the leadframe 902. Therefore, for example, the various leads 912, 1024, 1026 may be of sufficient dimensions in width and/or depth to support the current flow, while still maintaining the sufficient creepage and clearance distances, as just referenced.

Described examples provide lower inductance than existing solutions, due to, for example, the flip-chip and surface mounting techniques described herein, and facilitated by relatively short and wide pattern lengths enabled by the disclosed design of direct leadframe attachment.

The absence of wired connections also facilitates thermal dissipation and higher current-carrying capacities. For example, currents may be carried at over 200 A.

Lower thermal resistance (e.g., junction-to-case or Rthjc) may be provided due to the described dual substrates 908, 910 and use of Ag Sintering. The Ag sintering further facilitates high temperature applications, as compared to the use of conventional solder materials.

In FIG. 10, lead 1004 and lead 1012 represent Kelvin sense pins. By providing sense pins for both SiC MOSFETs 904, 906, very efficient switching is enabled. Additionally, increased reliability is provided due to the illustrated gull wing leads, including drain/collector gull wing leads and source/emitter gull wing leads, which are flexible to resist thermal cycles and low coefficient of thermal expansion (CTE) DBC material. Further, the described high thermal performance provides flexibility to use substrate materials including, e.g., Aluminum Nitride (AlN), Silicon Nitride (SiN), Aluminum Oxide ($AL_2O_3$) and Beryllium Oxide (BeO).

Figure 14:
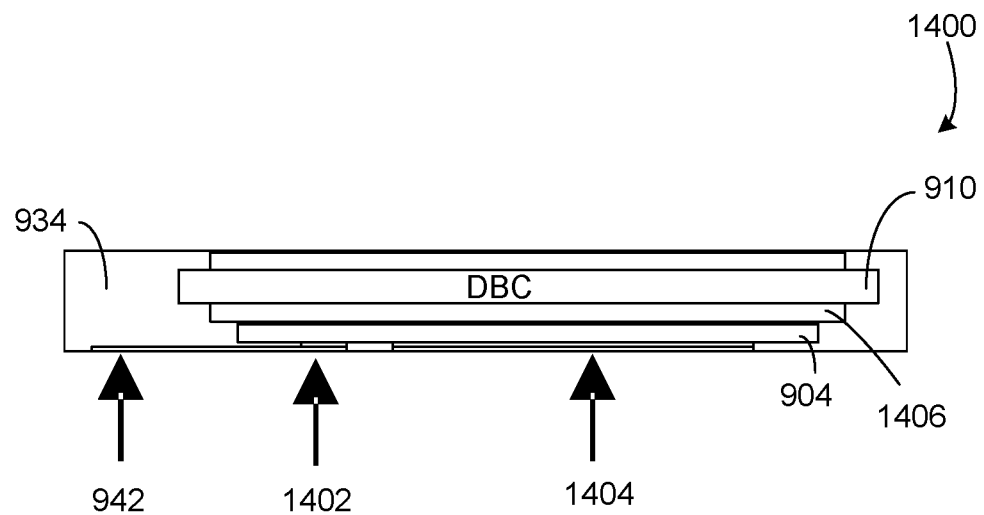
FIG. 14 is a first side view of an embedded die structure used in the example of FIGS. 9-13.
Figure 15:
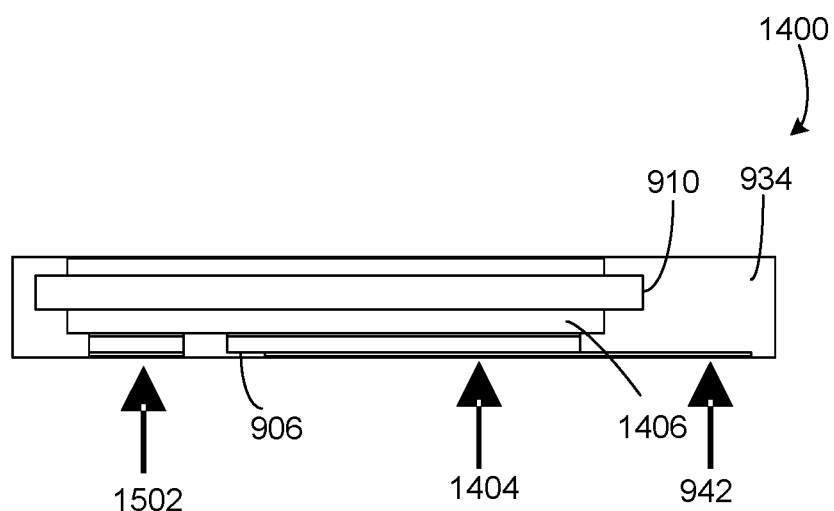
FIG. 15 is a second side view of the embedded die structure of FIG. 14.
Figure 16:
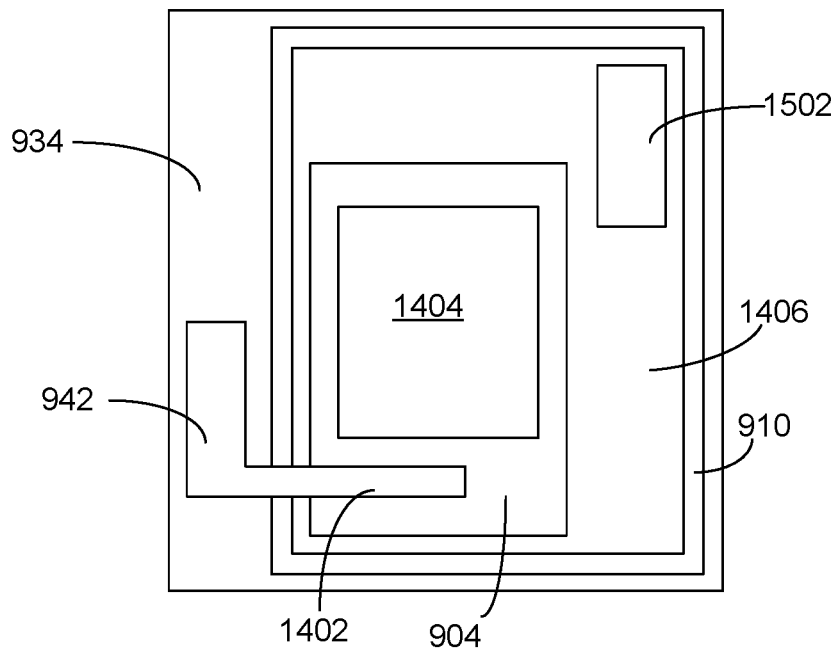
FIG. 16 is a top view of the embedded die structure of FIG. 14.
Figure 17:
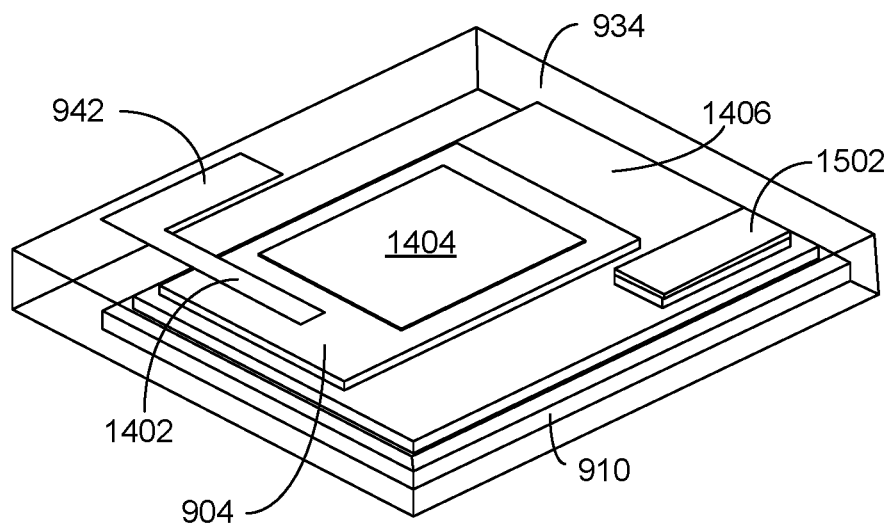
FIG. 17 is a top angle view of the embedded die structure of FIG. 14.

FIG. 14 is a first side view of an embedded die structure 1400 used in the example of FIGS. 9-13. FIG. 15 is a second side view of the embedded die structure 1400 of FIG. 14. FIG. 16 is a top view of the embedded die structure 1400 of FIG. 14. FIG. 17 is a top angle view of the embedded die structure 1400 of FIG. 14.

In the examples of FIGS. 14-17, a gate contact 1402 is illustrated as being connected to (e.g., integral with) the extended gate contact 942. A source contact 1404 is connected by the Ag sintering paste layer 938 (separately labelled in FIG. 9), and the gate contact 1402 is connected by Ag sintering paste layer 940, to a Cu plating layer 1406 of the DBC substrate 910. Thus, the Cu plating layer 1406 acts as a redistribution layer (RDL) for connecting the source and gate of the second MOSFET 904 in a desired manner. As may be seen in FIG. 15, similar comments apply to a drain contact 1502 of the second MOSFET 904, and the Ag sintering paste layer 936 (separately labelled in FIG. 9).

As may be seen in FIGS. 16 and 17, the extended gate contact 942 may be formed in a perpendicular or L-shaped fashion with respect to the gate contact 1402. Accordingly, it is possible to control a spacing between the source contact 1404 and the extended gate contact 942. As a result, as referenced above, the design of FIGS. 14-17 may facilitate configurable but reliable connections with the leadframe 902 of FIGS. 9-13, including conforming to a desired or available spacing between the leads 1008 and 1012.

Moreover, as referenced above, the structure of FIGS. 14-17, including the embedding of the included components within mold material 934, provides a planar contact surface that facilitates straightforward and reliable flipchip connection to the leadframe 902. Corresponding example assembly operations are described below with respect to FIG. 18.

Figure 18:
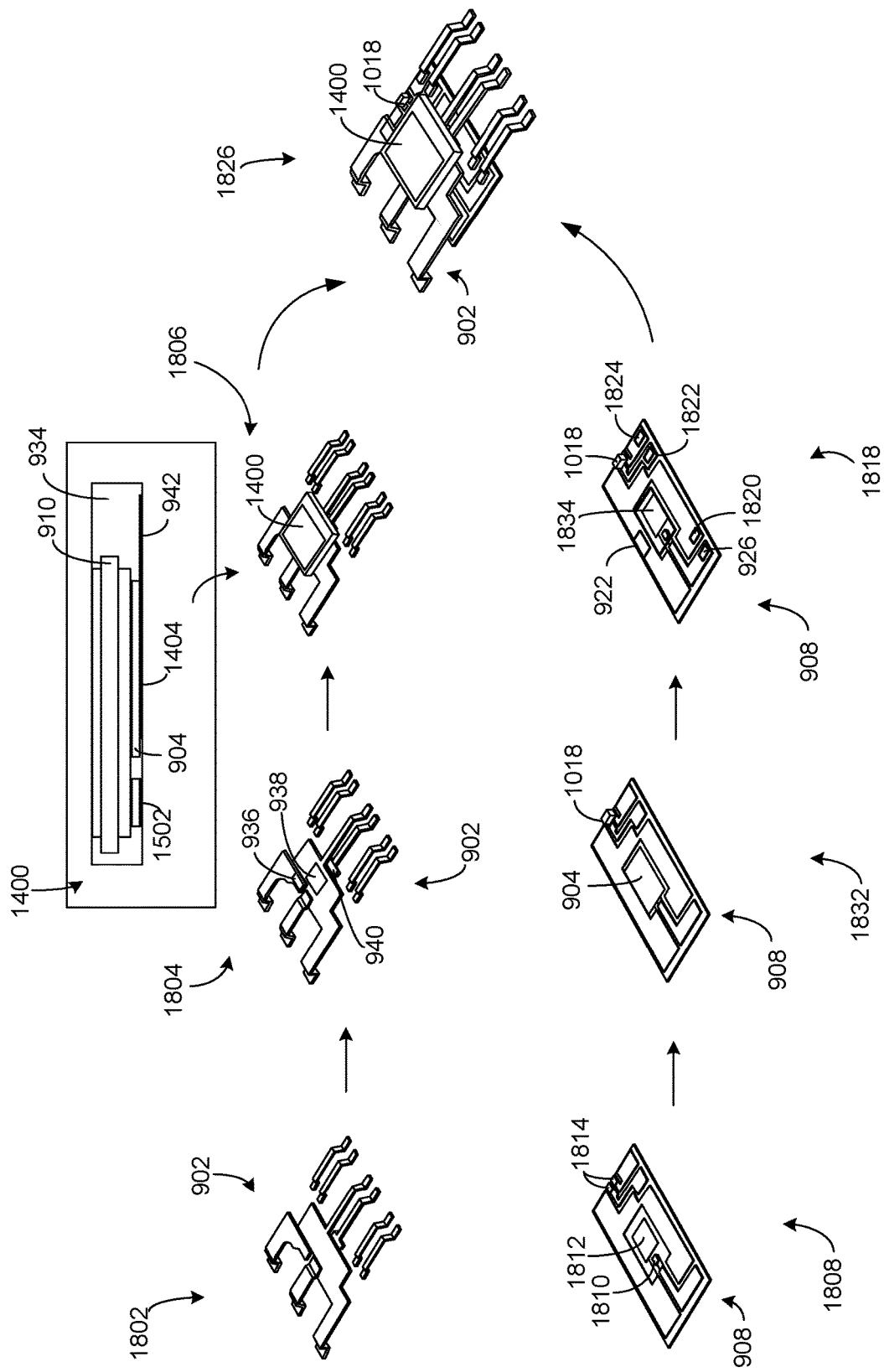
FIG. 18 is an example process flow for assembling the example implementation of FIGS. 9-17.

FIG. 18 is an example process flow for assembling the example implementation of FIGS. 9-17. At operation 1802, the leadframe 902 is prepared for assembly, which begins with the dispensing of Ag sinter paste during an operation 1804.

As shown, the Ag sinter paste dispensing dispenses the paste layers 936, 938, and 940, which, as illustrated in FIG. 9, provide contact connections for the drain, source, and gate of the second MOSFET 904, respectively. Then, in an operation 1806, the embedded die structure 1400 of FIGS. 14-17 may be easily flip-mounted or otherwise attached, and assembled to the leadframe 902 using Ag sintering.

In an operation 1808, Ag sinter paste is dispensed to define paste layers 1810, 1812, and 1814 on the first substrate 908, illustrated as a DBC with half etch formations for defining desired connections. Then, in an operation 1816, As shown, paste layer 1810 and paste layer 1812 may be used to attach the first MOSFET 906 by Ag sintering. Specifically, gate and source connections are formed, respectively. Further, the NTC 1018 may be sintered to the paste layers 1814.

In an operation 1818, Ag sinter paste layers 922, 924, 926 of FIG. 9 are dispensed, along with Ag sinter paste layers 1820, 1822, 1824 that are not visible in FIG. 9. Then, in an operation 1826, a final assembly may be constructed by performing a leadframe attach operation in which the leadframe 902 is Ag sintered to the assembly of operation 1818.

Figure 19:
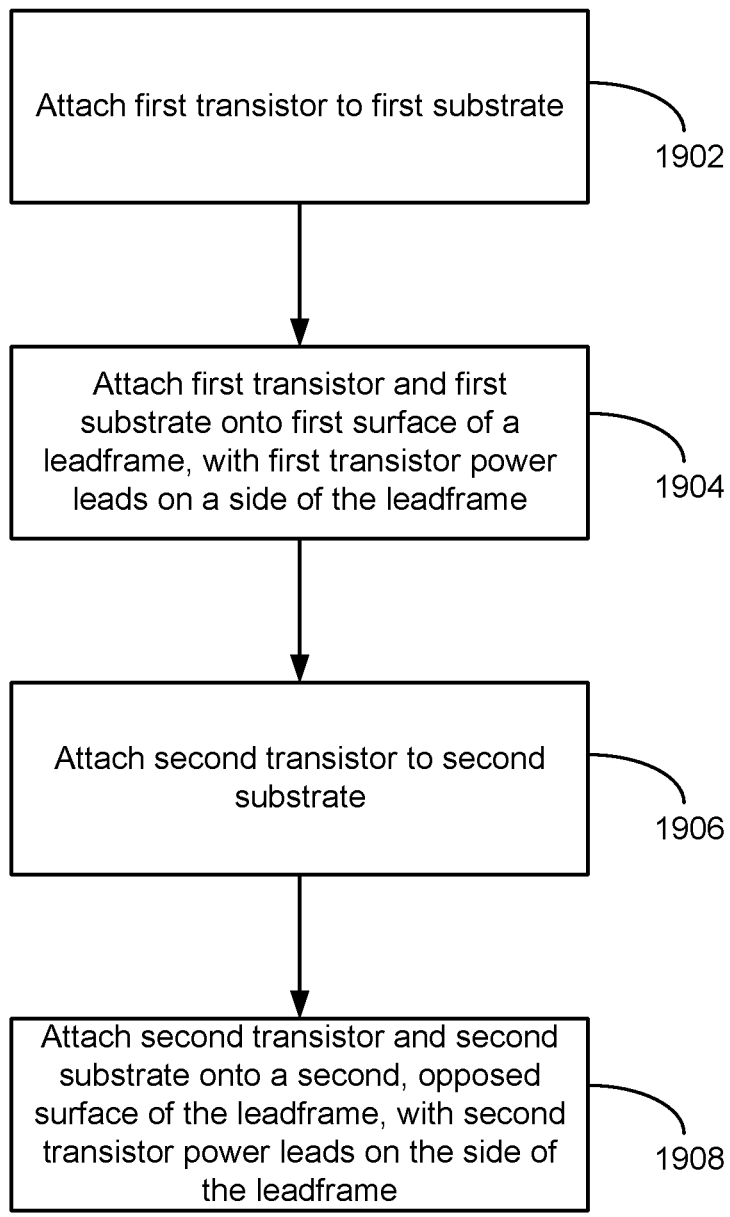
FIG. 19 is a flowchart illustrating example process steps corresponding to the process flow of FIG. 18.

FIG. 19 is a flowchart illustrating example process steps corresponding to the process flow of FIG. 18. In FIG. 19, a first transistor is attached to a first substrate (1902). For example, the first MOSFET 906 may be attached to the substrate 908 using Ag sintering.

The first transistor and the first substrate may be attached onto a first surface of a leadframe with first transistor power leads on a side of the leadframe (1904). For example, the first MOSFET 906 and the substrate 908 may be attached onto the leadframe 902, on a surface corresponding to surfaces 918, 919 in FIG. 9. The power leads of the first MOSFET 906, e.g., the leads 912 and 1024 connected to a drain and source of the first MOSFET 906, respectively, are on the same side (left side in the illustration of FIG. 10), thereby providing desired creepage and clearance distances for high power applications.

A second transistor is attached to a second substrate (1906). For example, the second MOSFET 904 may be attached to the substrate 910 using Ag sintering or high Pb solder paste.

The second transistor and the second substrate may be attached onto a second, opposed surface of a leadframe with second transistor power leads on the side of the leadframe (1908). For example, the second MOSFET 904 and the substrate 910 may be attached onto the leadframe 902, on a surface corresponding to surfaces 916, 917 in FIG. 9, which are vertically opposed to the surfaces 918, 919. The power leads of the second MOSFET 904, e.g., the leads 912 and 1026 connected to a source and drain of the second MOSFET 904, respectively, are on the same side (left side in the illustration of FIG. 10).

Figure 20:
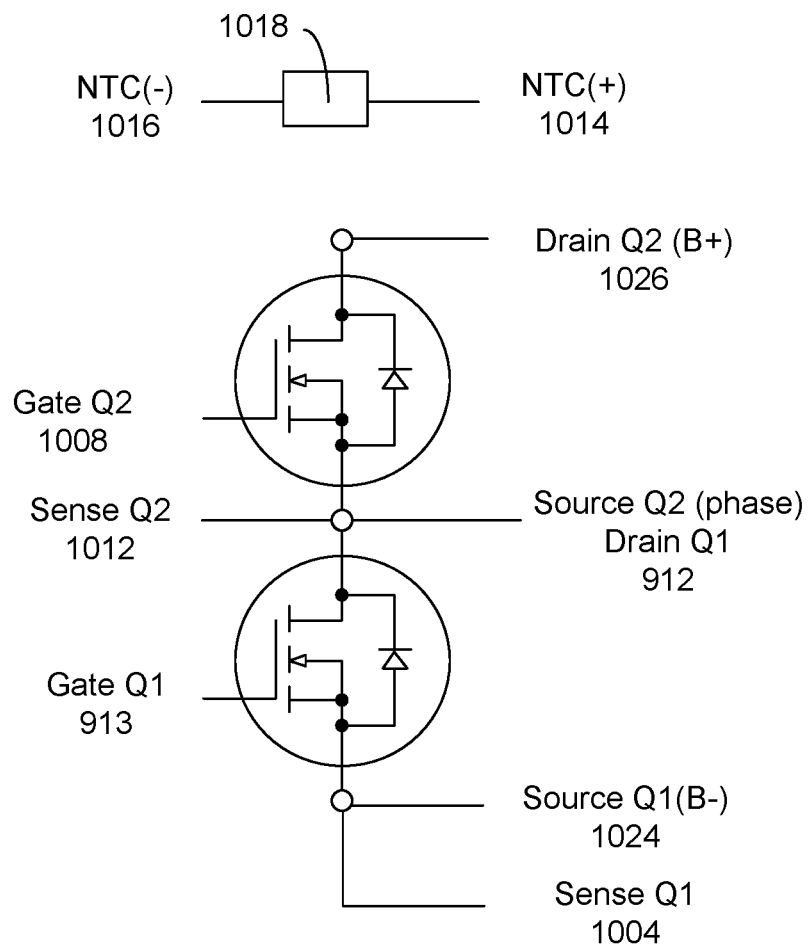
FIG. 20 is an example circuit diagram corresponding to the example implementation of FIGS. 9-19.

FIG. 20 is an example circuit diagram corresponding to the example implementation of FIGS. 9-19. As shown in FIG. 20, a half-bridge inverter configuration may be achieved through the techniques of FIGS. 9-19.

Figure 21:
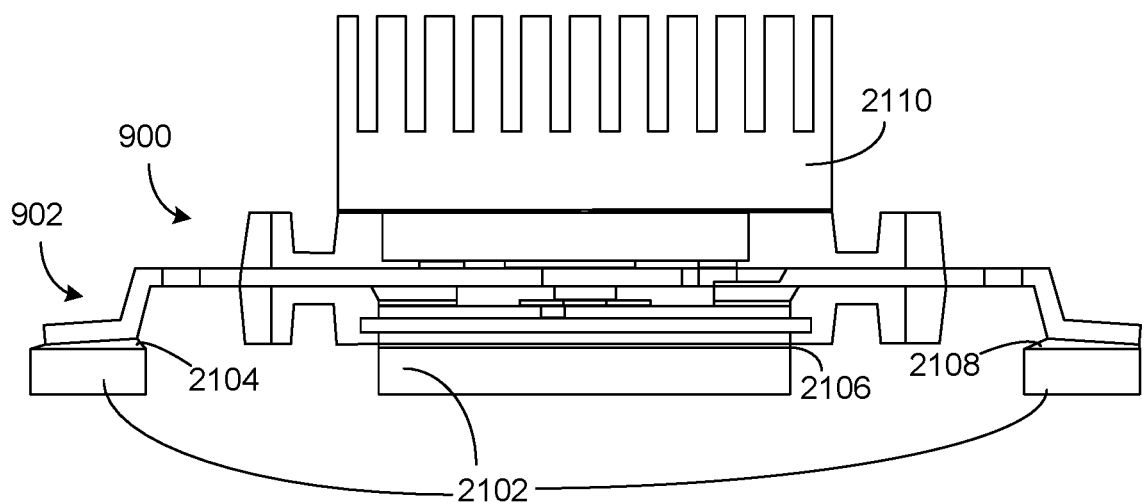
FIG. 21 is a side view of an example mounting of the example implementation of FIGS. 9-19.

FIG. 21 is a side view of an example mounting of the example implementation of FIGS. 9-19. In the example of FIG. 9, a circuit board 2102 is used to mount the package 900 of FIG. 9. As shown, solder layers 2104 and 2108 may be used to solder the leadframe 902 to the circuit board 2102. A heatsink 2110 may be soldered to an opposed surface of the package 900.

In the configuration of FIG. 21, full isolation is provided by both bonded surfaces, as the dual DBC structure enables straightforward soldering on both surfaces of the package 900. As a result, it is not necessary to use any separate thermally insulating material (TIM) or mechanical clips to connect the package 900 to either the circuit board 2102 or the heatsink 2110.

Further, surface mounting the MOSFETS 904, 906 to the leadframe 902 as described herein provides a number of advantages. For example, the drain/source connections are not exposed on the cooling side of the structure. Further, an overall size of the package 900 may be reduced as compared to conventional side-by-side transistor mounting.

Figure 22:
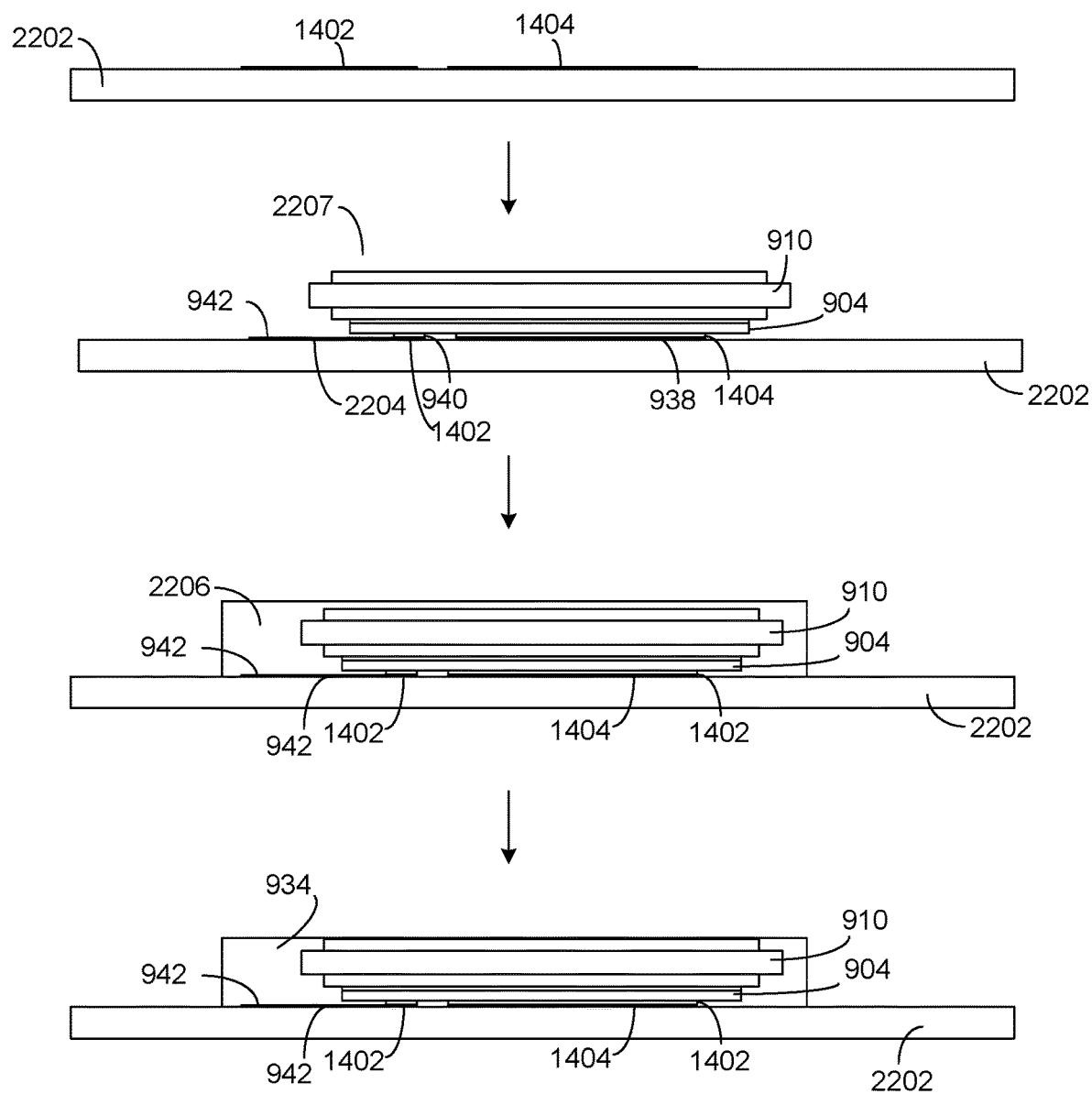
FIG. 22 is a first example process flow for assembling the embedded die of FIGS. 14-17.
Figure 23:
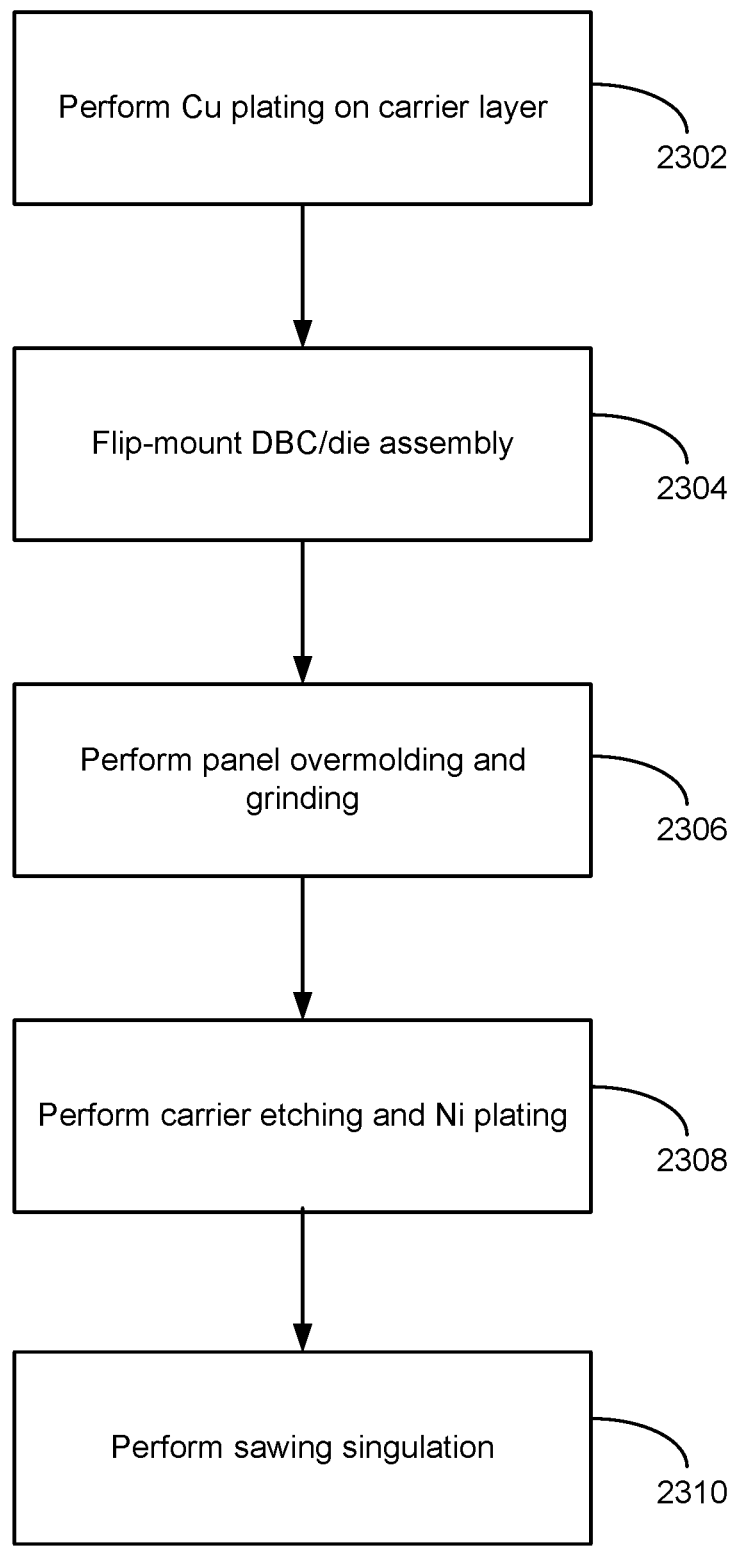
FIG. 23 is a flowchart illustrating example process steps corresponding to the process flow of FIG. 22.

FIG. 22 is a first example process flow for assembling the embedded die of FIGS. 14-17. FIG. 23 is a flowchart illustrating example process steps corresponding to the process flow of FIG. 22.

In the example of FIG. 22, and with reference to the flowchart of FIG. 23, a carrier layer 2202 may be implemented using prepreg, which refers to a printed circuit board material, or other dielectric material, e.g., a few hundred microns of prepreg, such as 400 microns of prepreg, which then undergoes copper plating in a pre-defined mask pattern to form gate contact layer 1402 (including extended gate contact 942, not visible in FIG. 22) and source contact layer 1404 (2302).

Then, a DBC/die assembly 2204 that includes the DBC substrate 910 and the second MOSFET 904 is flip-mounted or otherwise attached to the layers 1402, 1404, using Ag sinter paste layers 940, 938, respectively (2304). Although FIG. 22 illustrates a single DBC/die assembly 2204, it will be appreciated that the carrier layer 2202 may be patterned with a plurality of Cu plating patterns, and a corresponding plurality of DBC/die assemblies may be flip-mounted or otherwise attached thereto thereto.

Panel overmolding of all such flip-mounted assemblies may then proceed, followed by grinding of the overmolding (2306). For example, EMC 2206 may overmolded around the DBC/die assembly 2207, followed by grinding to expose the DBC 910. As shown in FIG. 22, the result is the embedded die structure 1400 of FIG. 14, still attached to the carrier layer 2202.

In subsequent steps, the carrier layer 2202 may be etched away, and Nickel (Ni) plating may be added to the contacts 1402, 1404 to enhance connectivity thereof (2308). In this way, sawing and singulation of the embedded die(s) 1400 may proceed (2310).

Figure 24:
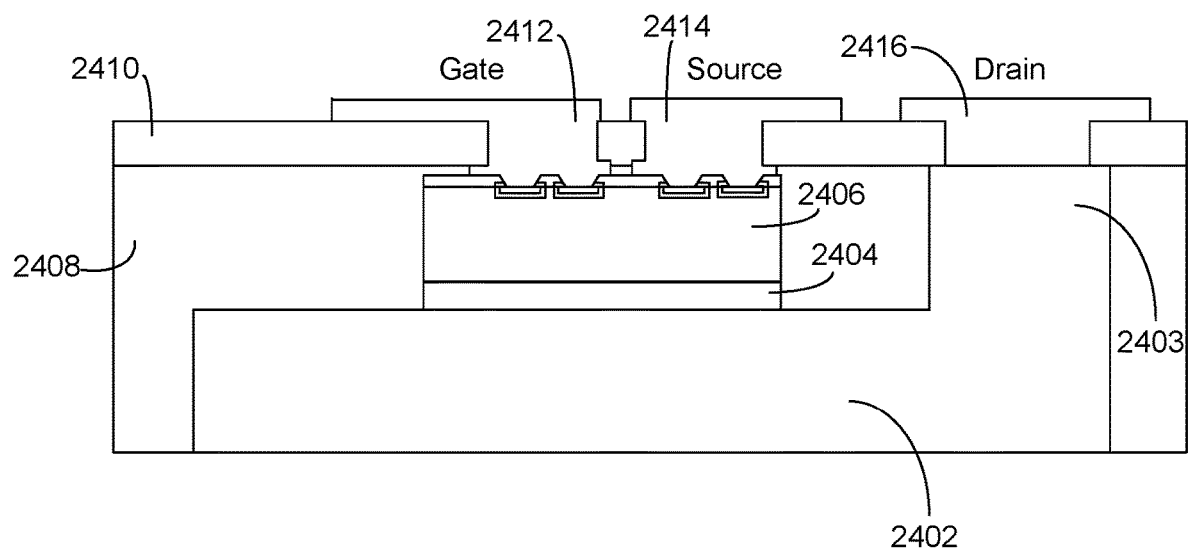
FIG. 24 is an alternate example implementation of the embedded die of FIGS. 14-17.
Figure 25:
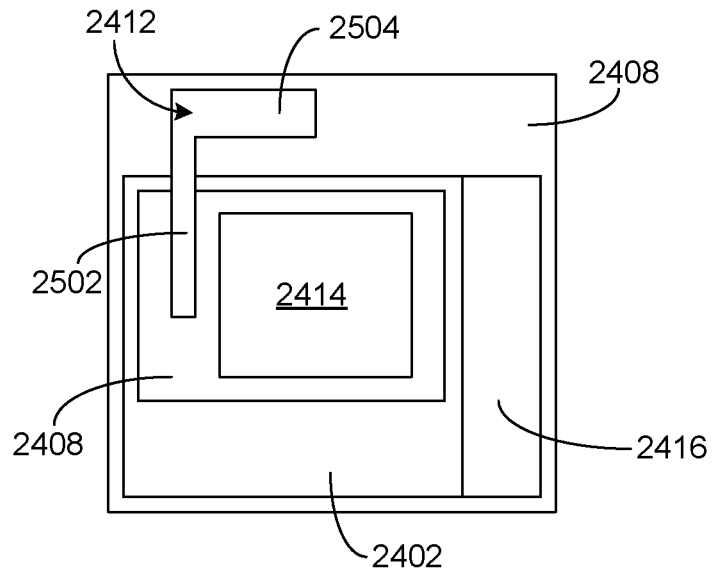
FIG. 25 is a top view of the implementation of FIG. 24.
Figure 26:
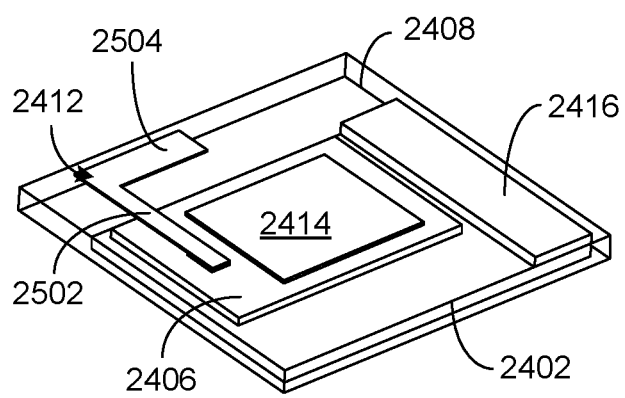
FIG. 26 is a top angle view of the implementation of FIGS. 24 and 25.
Figure 27:
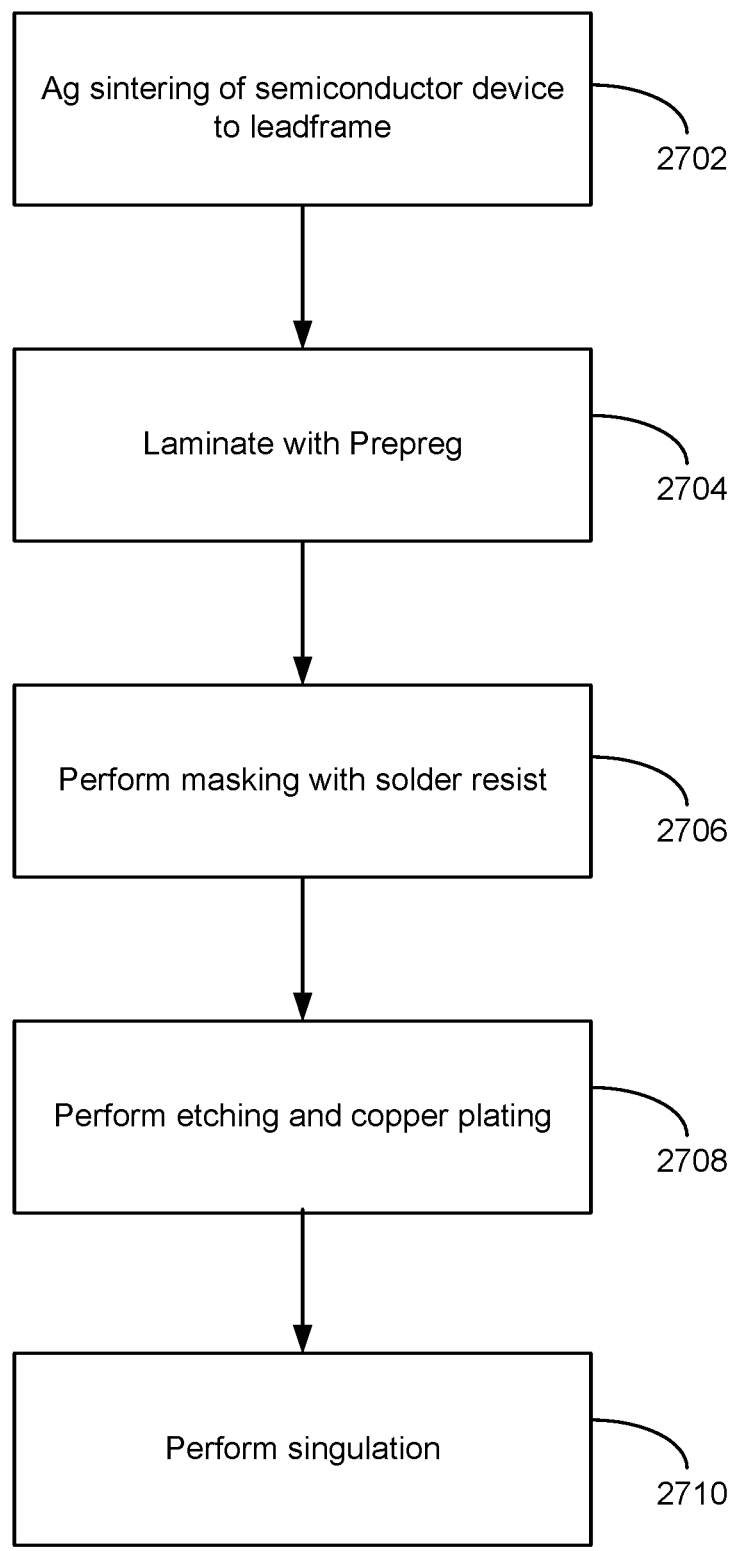
FIG. 27 is a flowchart illustrating example process steps corresponding to the example implementation of FIGS. 24-26.

FIG. 24 is an alternate example implementation of the embedded die of FIGS. 14-17. FIG. 25 is a top view of the implementation of FIG. 24. FIG. 26 is a top angle view of the implementation of FIGS. 24 and 25. FIG. 27 is a flowchart illustrating example process steps corresponding to the example implementation of FIGS. 24-26, and construction of the example implementation of FIGS. 24-26 is described with reference to the flowchart of FIG. 27.

In FIG. 24, and with reference to FIG. 27, a conductive leadframe 2402 is sintered by Ag sintering paste or epoxy 2404, e.g., Ag sintering paste, to a semiconductor device 2406 (2702). For example, the leadframe 2402 may be implemented as a Cu leadframe and the semiconductor device 2406 may represent or correspond to the second MOSFET 904 in the preceding examples. As shown, the leadframe 2402 may provide an example implementation of the second substrate 110 of FIG. 1, and including a perpendicular portion 2403, as described below.

Prepreg 2408 may be laminated around the leadframe 2402 and the semiconductor device 2406 (2704). In this way, the semiconductor device 2406 is embedded without requiring molding, e.g., without requiring a mold material such as EMC.

Then, a layer of solder resist material 2410 may be used in a masking step to provide contact openings for gate contact 2412, source contact 2414, and drain contact 2416 (2706). Then, corresponding etching and copper plating may be conducted to complete the contact formation (2708). Finally, singulation of individual embedded die assemblies as shown in FIG. 24 may be completed (2710).

As may be seen in FIGS. 25 and 26, the gate contact 2412 may be patterned and formed in the extended, L-shaped structure described above, having two perpendicular portions 2502 and 2504. Moreover, the leadframe 2402, by providing the perpendicular portion 2403, enables a single-surface, planar connection to all of the source, gate, and drain of the semiconductor device 2406. Accordingly, as illustrated and described above, it is straightforward to attach the embodiments of FIGS. 24-27 to a plurality of different types of available leadframes, such as the leadframe 902.

Figure 28:
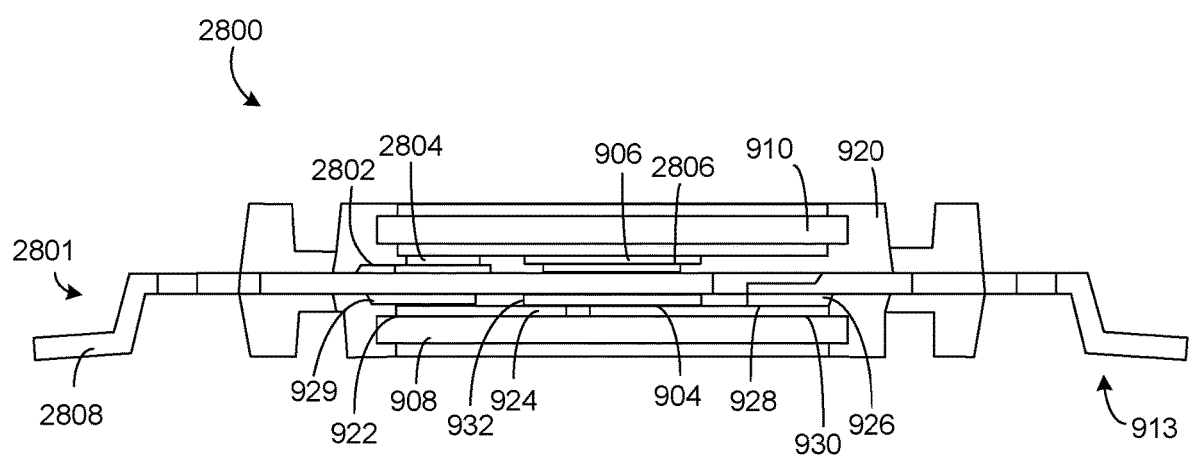
FIG. 28 is a side view of an alternate example implementation of the implementation of FIG. 9, with an alternative leadframe and no embedded die structure.
Figure 29:
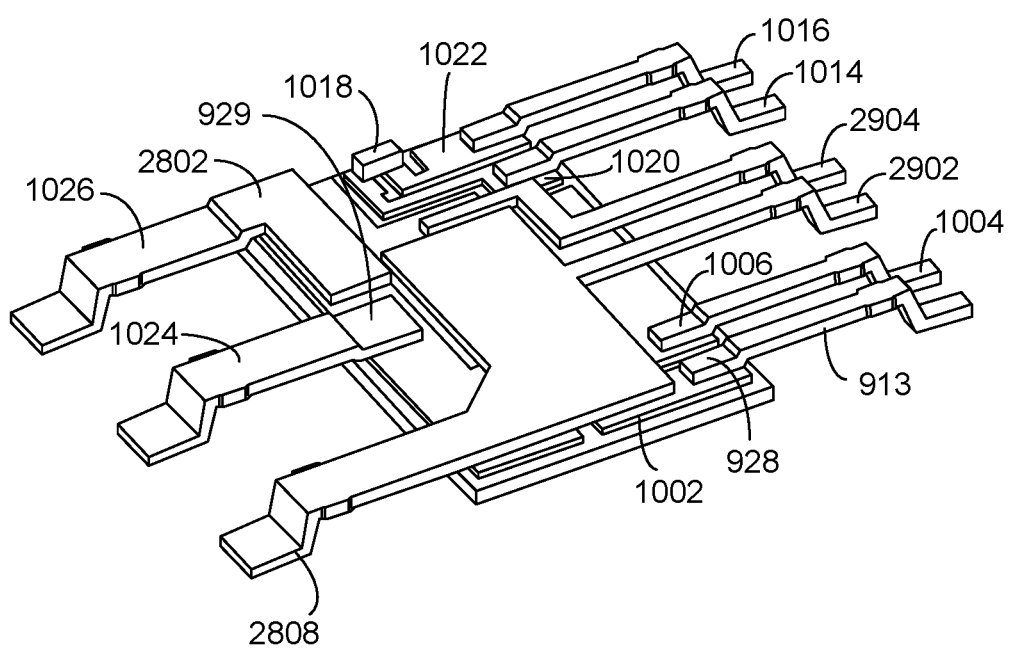
FIG. 29 is a top angle view of a leadframe used in the example of FIG. 28.
Figure 30:
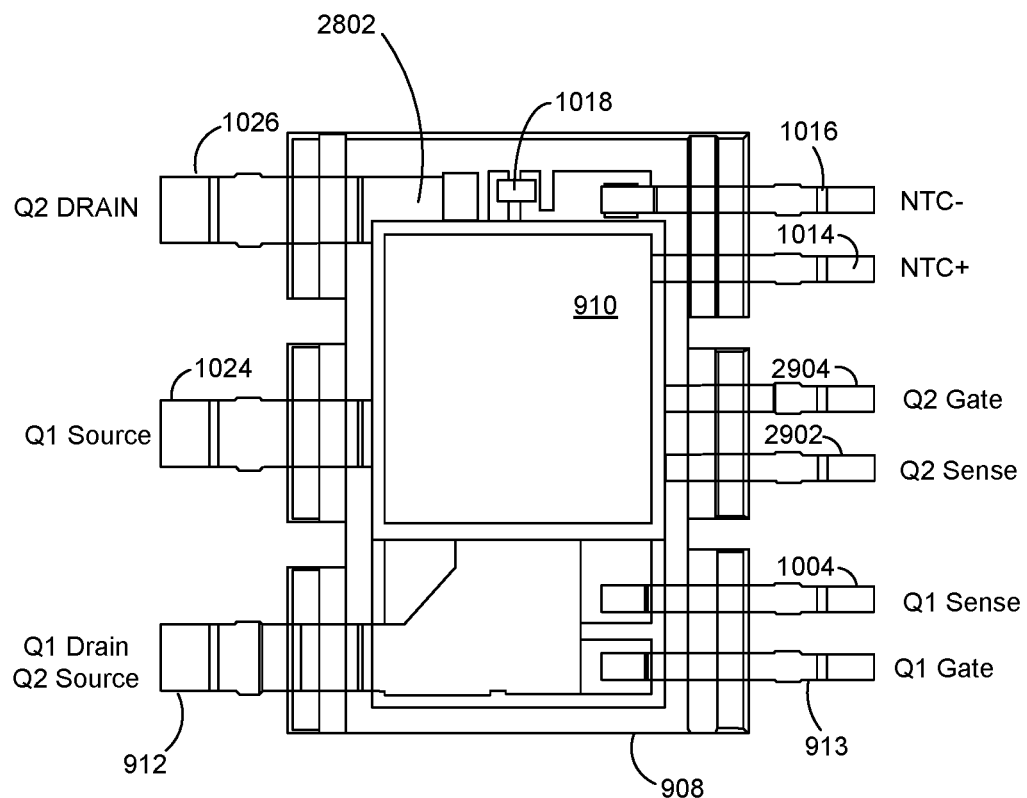
FIG. 30 is a top view of the example implementation of FIGS. 28 and 29.

FIG. 28 is a side view of an alternate example implementation of the implementation of FIG. 9, with an alternative leadframe and no embedded die structure. FIG. 29 is a top angle view of a leadframe used in the example of FIG. 28. FIG. 30 is a top view of the example implementation of FIGS. 28 and 29.

In FIGS. 28-30, a semiconductor device package 2800 includes a leadframe 2801 that is an alternative to the leadframe 902 of FIG. 9. Portions of the semiconductor device package 2800 that are the same as in the semiconductor device package 900 are numbered using like reference numerals.

An upset 2802 is included on the lead 1026, and a solder layer 2804 attaches the upset 2802 to the second substrate 910, and thereby to the drain of the second MOSFET 904. A separate solder layer 2806 attaches the second MOSFET 904 to a lead 2808, acting as the source lead for the second MOSFET 904, and the drain lead for the first MOSFET 906.

In FIG. 29, a lead 2902 is attached to, or integral with, the lead 2808, and provides a sense lead for the second MOSFET 904. A lead 2904 provides a gate lead for the second MOSFET 904, as shown in FIG. 30. As also visible in FIGS. 29 and 30, the source and drain leads 2808, 1024, and 1026 are maintained as the power leads on one side of the package, to maximize creepage and clearance distances therebetween. For example, the implementation of FIGS. 28-30 may provide a clearage distance of at least 3-5 mm or more, and a clearance distance of 8-10 mm or more for the power leads 2808, 1024, 1026. On the other side of the package, clearance distances between pairs of leads 913/1004, 2902/2904, and 1014/1016 may be provided in a range of 3-4 mm or more, while corresponding creepage distances may be 6-8 mm or more.

Figure 31:
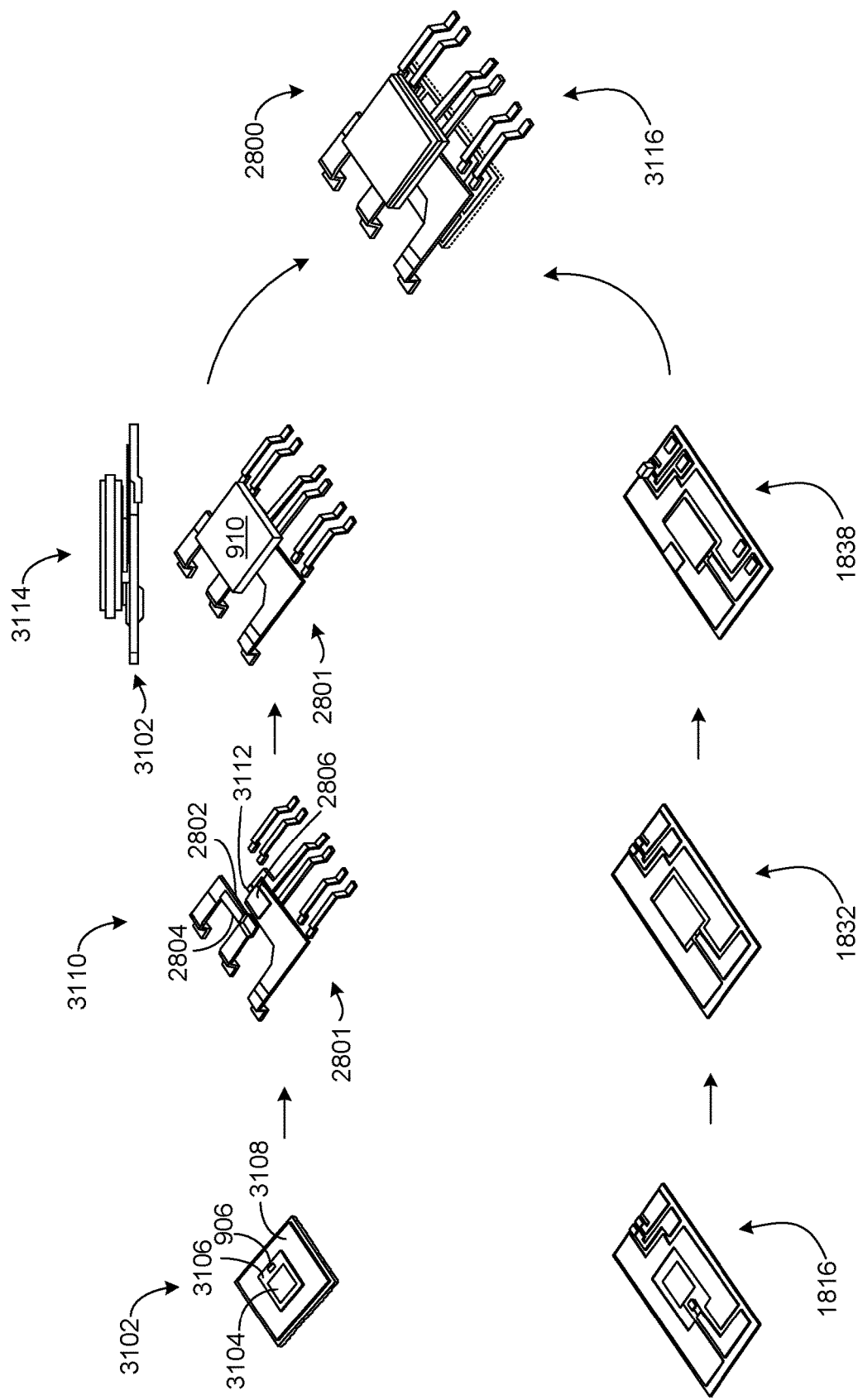
FIG. 31 is an example process flow for assembling the example implementations of FIGS. 28-30.

FIG. 31 is an example process flow for assembling the example implementations of FIGS. 28-30. In FIG. 31, operations for assembling the first MOSFET 906 and the first substrate 908 are substantially the same as in FIG. 18, and are numbered accordingly in FIG. 31 and not described here in further detail.

With respect to the second MOSFET 904 and the second substrate 910, an operation 3102 illustrates that the second substrate 910 has the second MOSFET 904 attached to a Cu layer 3108 of the second substrate 910, while Ag sinter paste layers 3104 and 3106 are dispensed for forming source and gate connections, respectively.

In an operation 3110, the leadframe 2801 has high Pb solder preform 2804 dispensed onto the upset 2802 for a drain connection to the second MOSFET 904. Solder preform 2806 is dispensed onto the lead 2808 for a source connection to the second MOSFET 904. Also visible in the operation 3110, solder preform 3112 is dispensed onto the lead 2904 for a gate connection to the second MOSFET 904.

Then, in an operation 3114, the structure of operation 3102 (shown in sideview in the operation 3114) may be flip-mounted to the leadframe 2801, using the solder preform layers 2804, 2806, 3112 and an associated reflow operation. Due to the presence of the upset 2802, the second MOSFET 904 may be attached in a planar manner, with the drain connection of the second MOSFET 904 being facilitated by the Cu layer 3108 of the second substrate 910, which is in contact with the upset 2802. Then in an operation 3116, the final semiconductor device package 2800 (shown without mold material 920) may be assembled.

In FIGS. 28-31, no embedding of the second MOSFET 904 is necessary to achieve the described attachment of FIG. 31. Further, the use of Ag sintering enables high temperature reflow for secure connections, as well as high temperature operating ranges expected for, e.g., SiC MOSFETS.

Figure 32:
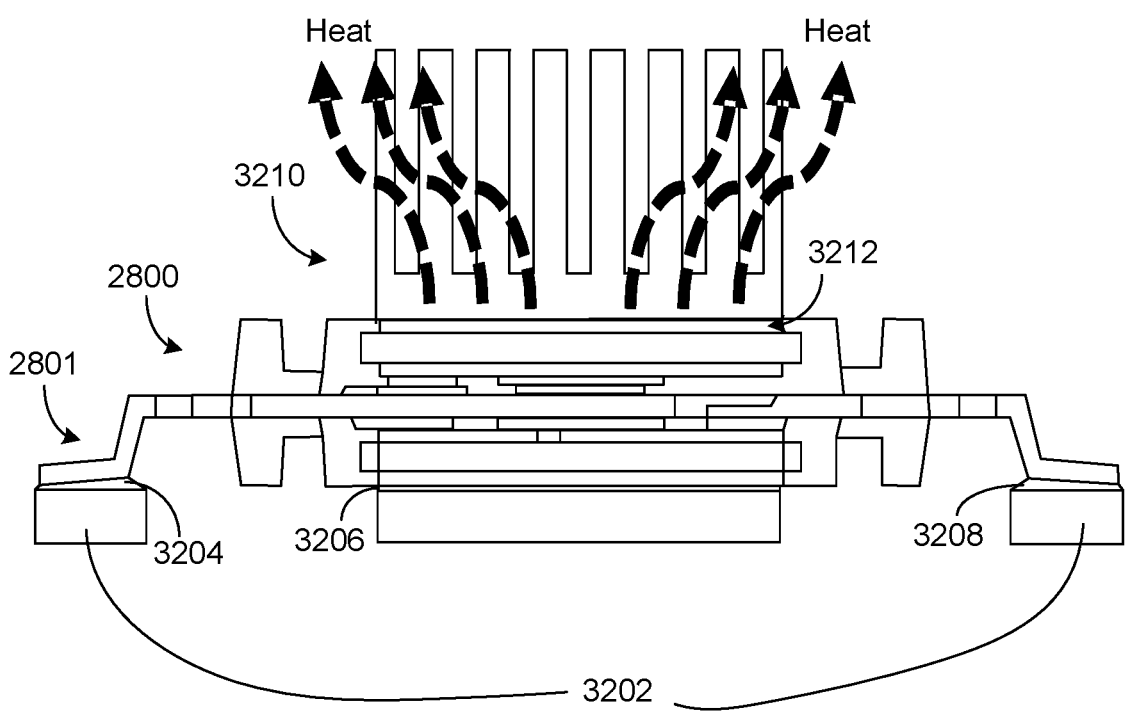
FIG. 32 is a side view of an example mounting of the example implementation of FIG. 28.

FIG. 32 is a side view of an example mounting of the example implementation of FIG. 28. In FIG. 32, a circuit board 3202 is used to mount the package 2800 of FIG. 28. As shown, solder layers 3204 and 3208 may be used to solder the leadframe 2801 to the circuit board 3202, while solder layer 3206 attached the package 2800 to the circuit board 3202. A heatsink 3210 may be soldered to an opposed surface of the package 2800, e.g., to a layer 3212 of the outer DBC substrate of the package 2800.

In the configuration of FIG. 32, full isolation is provided by both bonded surfaces, as the dual DBC structure enables straightforward soldering on both surfaces of the package 2800. As a result, it is not necessary to use any separate thermally insulating material (TIM) or mechanical clips to connect the package 2800 to either the circuit board 3202 or the heatsink 3210.

Figure 33:
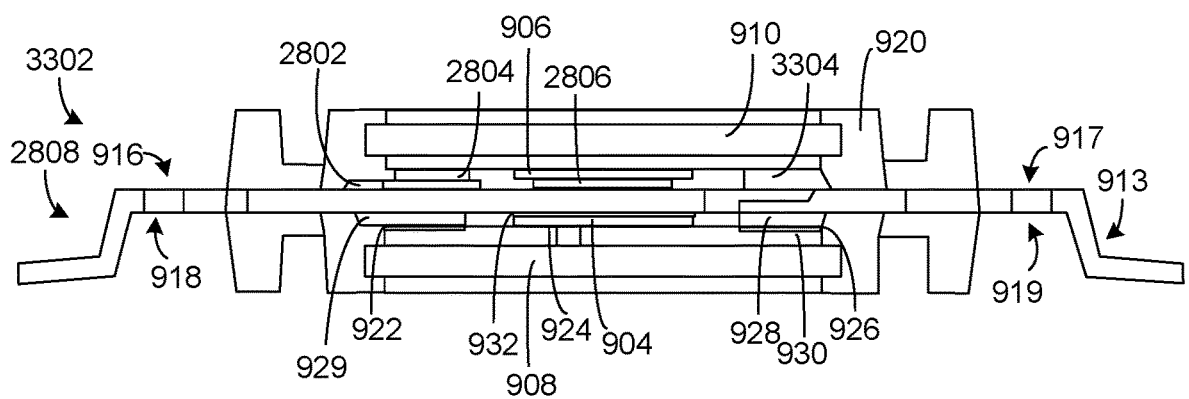
FIG. 33 is a side view of an alternate example implementation of the implementation of FIGS. 9 and 22, with an alternate leadframe and no embedded die structure.
Figure 34:
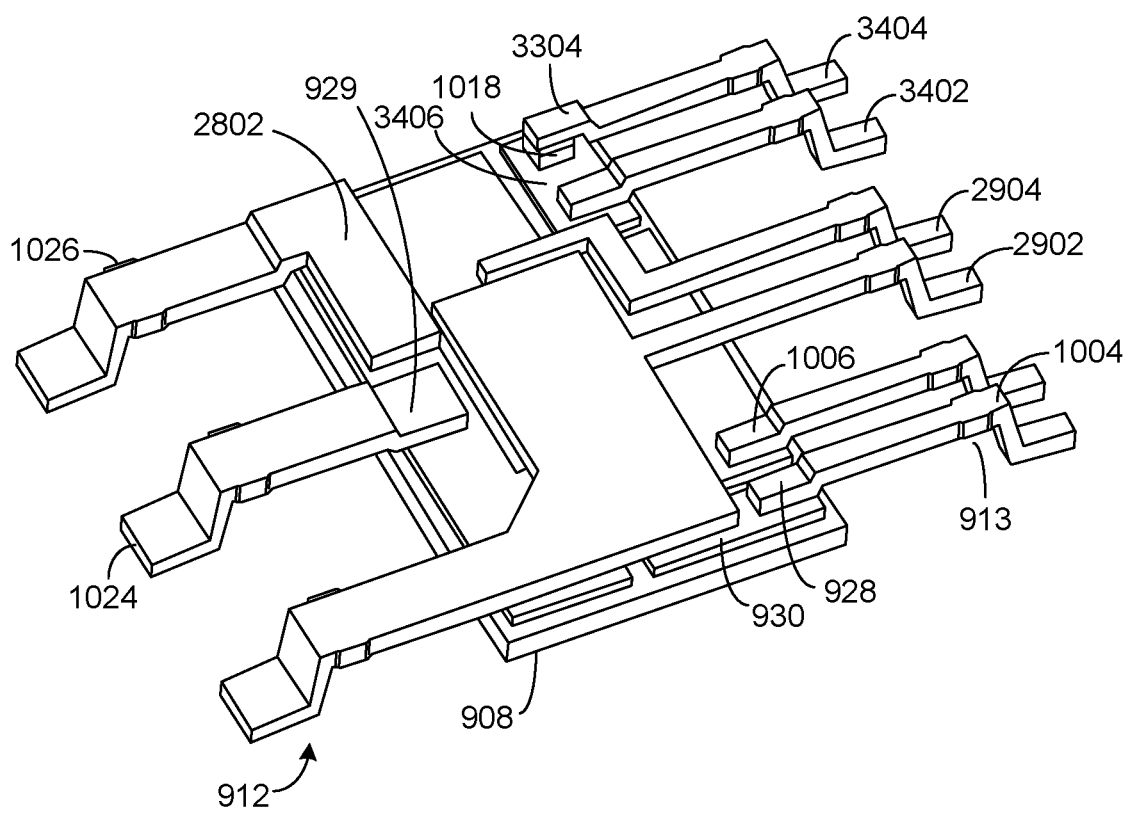
FIG. 34 is a top angle view of a leadframe used in the example of FIG. 33.
Figure 35:
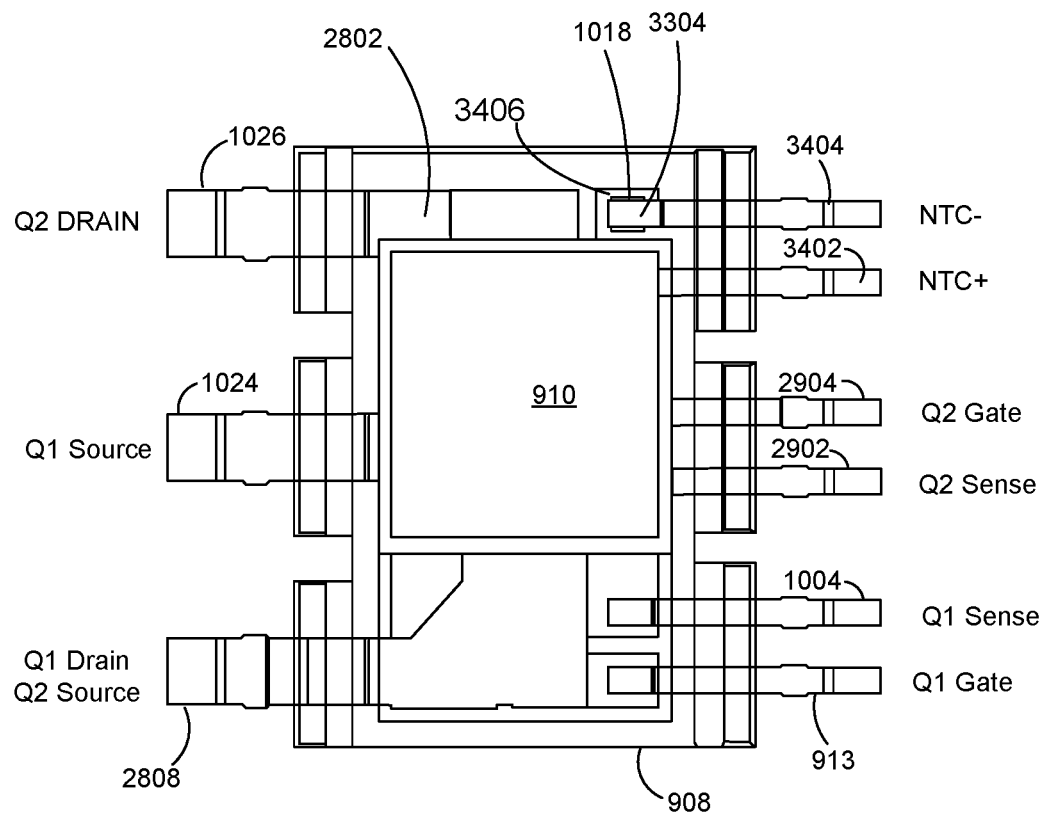
FIG. 35 is a top view of the example implementation of FIG. 33.
Figure 36:
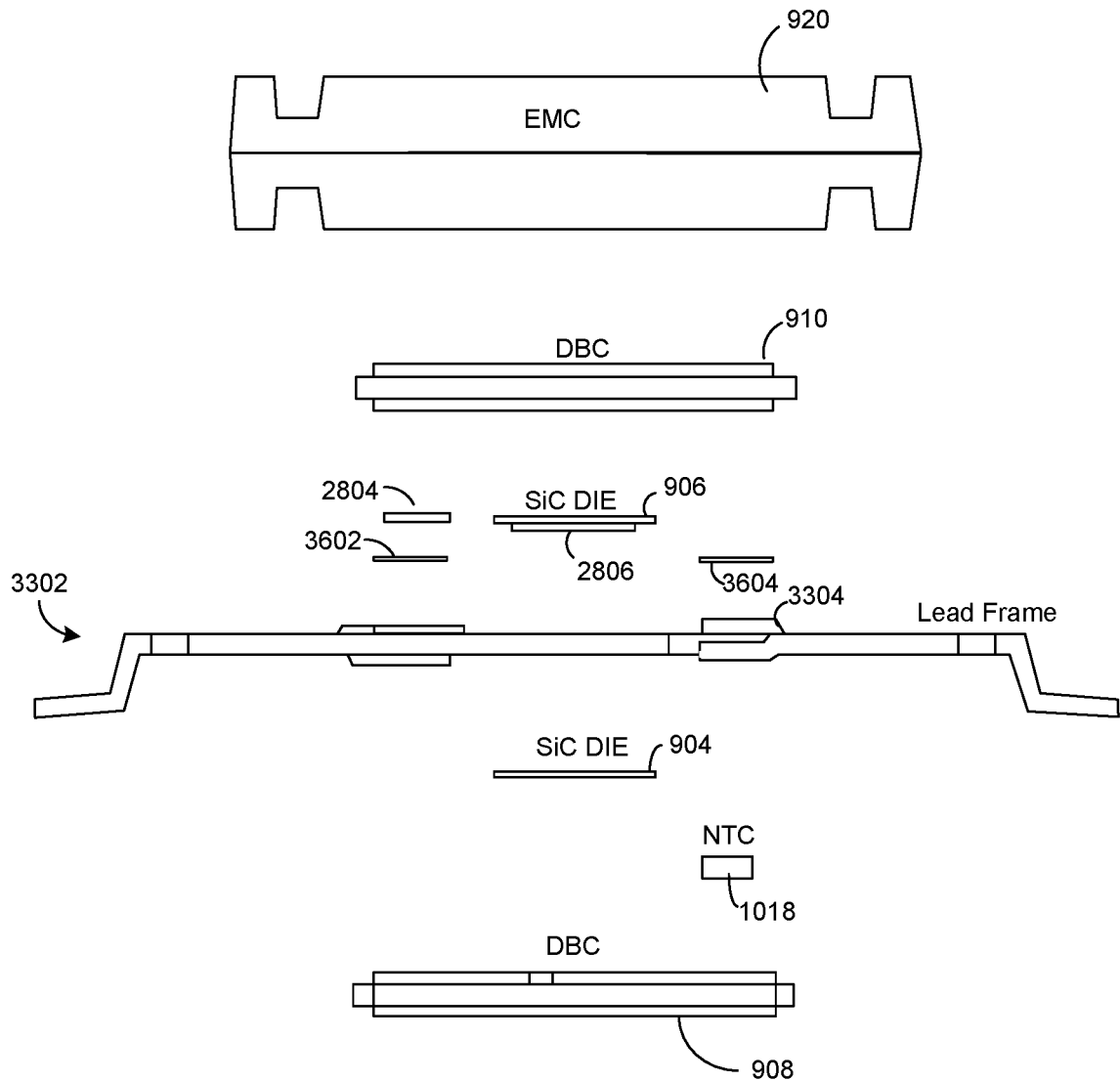
FIG. 36 is an exploded side view of the example implementation of FIG. 33.

FIG. 33 is a side view of an alternate example implementation of the implementation of FIGS. 9 and 22, with an alternate leadframe and no embedded die structure. FIG. 34 is a top angle view of a leadframe used in the example of FIG. 33. FIG. 35 is a top view of the example implementation of FIG. 33. FIG. 36 is an exploded side view of the example implementation of FIG. 33.

In FIG. 33, an alternative leadframe 3302 includes an additional upset 3304 for the NTC 1018. As shown in FIG. 34, NTC leads 3402 and 3404, including the upset on lead 3404 as shown, and with a modified etching of the conductive layer 930 of the substrate 910, enable an attachment of the NTC 1018. The exploded sideview of FIG. 36 illustrates additional Ag sinter layers 3602, 3604, which, as described herein, may enable and withstand higher temperatures during reflow and device operations then conventional solder. For example, the NTC 1018 may be implemented as a chip type NTC that has Ag plating on top and bottom surfaces thereof, and that can be sintered into the substrate 908 of, e.g., DBC.

Figure 37:
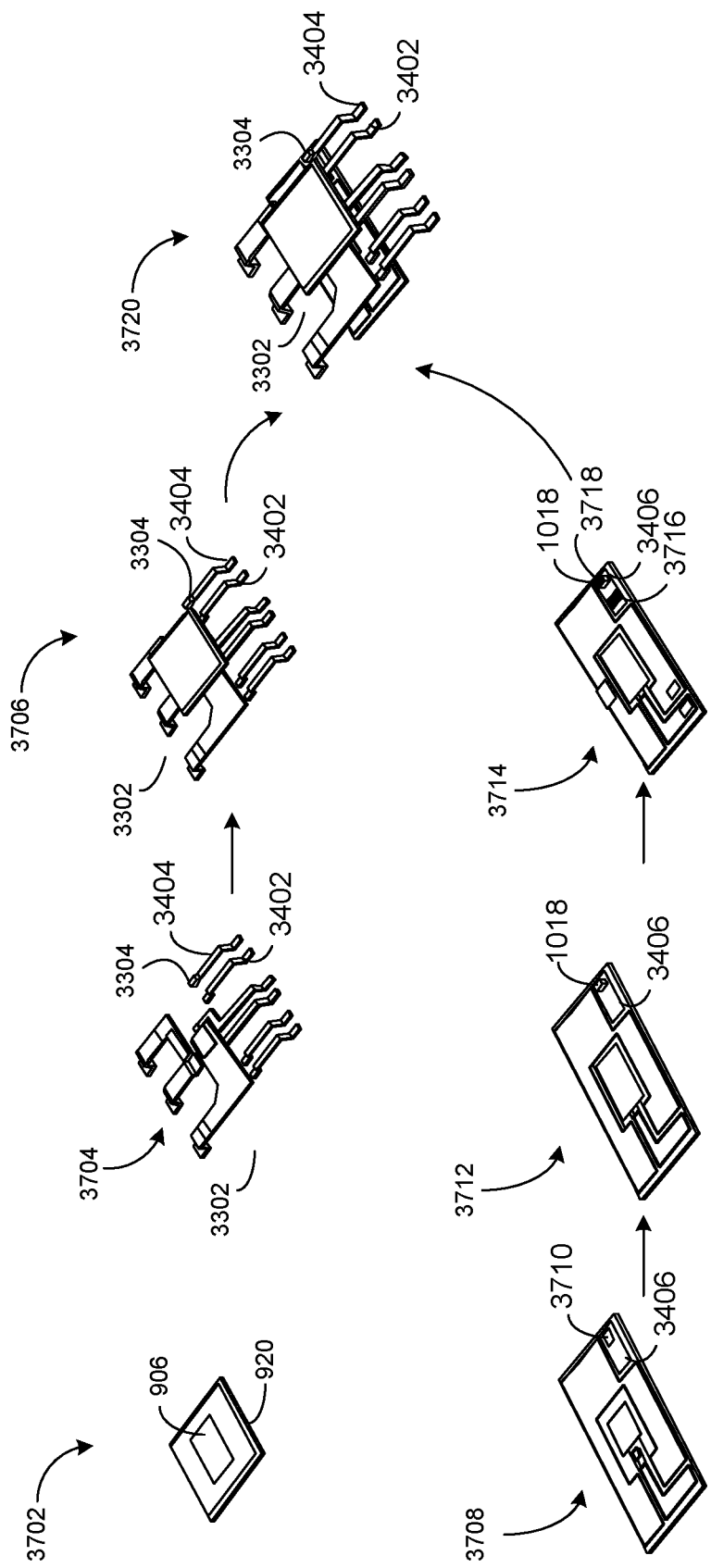
FIG. 37 is an example process flow for assembling the example implementations of FIGS. 33-36.

FIG. 37 is an example process flow for assembling the example implementations of FIGS. 33-36. Portions of FIG. 37 that are duplicative of the process flows of FIGS. 18 and 31 are not necessarily described or labelled separately in FIG. 37.

In an operation 3702, the second MOSFET 906 is Ag sintered to the substrate 910, and then in operation 3704, high Pb lead solder preform is applied. In an operation 3706, the second MOSFET 906 and the substrate 910 are attached to the leadframe and a reflow operation is used to complete the attachment.

In operation 3708, Ag sinter paste layer 3710 is applied to the etched conductive portion 3406, so that the solderable NTC 1018 may be attached thereto in an operation 3712. In operation 3714, additional Ag sinter paste layers 3716 and 3718 are applied to the etched conductive portion 3406 and to the NTC 1018. Then, in operation 3720, the leadframe 3302 is attached by Ag sintering.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A semiconductor device package, comprising:
   a first transistor attached to a first substrate and to a first surface of a leadframe, with first transistor power leads on a side of the leadframe; and
   a second transistor attached to a second substrate and to a second surface of the leadframe, with second transistor power leads in planar contact with corresponding leads of the leadframe on the side of the leadframe.

2. The semiconductor device package of claim 1, wherein the first transistor and the second transistor are Silicon Carbide (SiC) transistors.

3. The semiconductor device package of claim 1, wherein the first substrate and the second substrate are direct bonded copper (DBC) substrates.

4. The semiconductor device package of claim 1, wherein the second transistor is embedded together with the second substrate, and having planar source, gate, and drain contacts for attaching to the second surface of the leadframe.

5. The semiconductor device package of claim 1, wherein the leadframe has a drain lead for the second transistor with an upset for making contact with the second transistor, to thereby maintain planar contact of the second transistor with respect to the leadframe, and to the second substrate.

6. The semiconductor device package of claim 1, wherein the first transistor is mounted to the first substrate using Ag sintering, and the second transistor is mounted to the second substrate and to the leadframe using Ag sintering.

7. The semiconductor device package of claim 1, further comprising a temperature sensor attached to the first substrate.

8. A method of making a semiconductor device package, comprising:
attaching a first transistor to a first substrate;
attaching the first transistor and the first substrate onto a first surface of a leadframe, with first transistor power leads on a side of the leadframe;
attaching a second transistor to a second substrate; and
attaching the second transistor and the second substrate onto a second, opposed surface of the leadframe, with second transistor power leads in planar contact with corresponding leads of the leadframe on the side of the leadframe.

9. The method of claim 8, further comprising:
embedding the second transistor together with the second substrate, and having planar source, gate, and drain contacts for attaching to the second, opposed surface of the leadframe.

10. The method of claim 8, further comprising attaching the second transistor with a drain of the second transistor attached to an upset of a drain lead of the leadframe, to thereby maintain planar contact of the second transistor with respect to the leadframe, and to the second substrate.

11. The method of claim 8, further comprising:
attaching the first transistor and the first substrate onto the first surface of the leadframe, with the first transistor power leads on the side of the leadframe connected to a first drain and a first source of the first transistor; and
attaching the second transistor and the second substrate onto the second, opposed surface of the leadframe, with the second transistor power leads on the side of the leadframe connected to a second drain and a second source of the second transistor.

12. The method of claim 8, further comprising:
attaching the second transistor to a lead of the first transistor power leads that provides a source lead for the second transistor, and a drain lead for the first transistor.

13. The method of claim 8, further comprising:
attaching the first transistor having a first gate thereof attached to a first gate lead on a second side of the leadframe that is opposed to the side; and
attaching the second transistor having a second gate thereof attached to a second gate lead on the second side of the leadframe.

14. A semiconductor device package, comprising:
a leadframe having first transistor power leads and second transistor power leads on a first side and third transistor power leads on a second side that is laterally spaced from the first side, and having a first surface and a second surface that is vertically opposed to the first surface;
a first substrate;
a first transistor attached to the first substrate and to the first surface of the leadframe, the first transistor having a first source contact and a first drain contact connected to the first transistor power leads on the first side of the leadframe, and having a first gate contact connected to the second transistor power leads on the second side of the leadframe;
a second substrate; and
a second transistor attached to the second substrate and to the second surface of the leadframe, the second transistor having a second source contact and a second drain contact connected to the second transistor power leads on the second side of the leadframe, and having a second gate contact connected to the second transistor power leads on the second side of the leadframe.

15. The semiconductor device package of claim 14, wherein the first transistor and the second transistor are Silicon Carbide (SiC) transistors.

16. The semiconductor device package of claim 14, wherein the first substrate and the second substrate are direct bonded copper (DBC) substrates.

17. The semiconductor device package of claim 14, wherein the second transistor is embedded together with the second substrate, and the second source contact, the second drain contact, and the second gate contact are planar.

18. The semiconductor device package of claim 14, wherein the second transistor power leads include a drain lead for connecting to the second drain contact of the second transistor, the drain lead including an upset for making contact with the second drain contact of the second transistor, to thereby maintain planar contact of the second transistor with respect to the leadframe, and to the second substrate.

19. The semiconductor device package of claim 14, wherein the first transistor is mounted to the first substrate using Ag sintering, and the second transistor is mounted to the second substrate and to the leadframe using Ag sintering.

20. The semiconductor device package of claim 14, further comprising a temperature sensor attached to the first substrate.

* * * * *